United States Patent
Tsuruda et al.

(10) Patent No.: US 11,636,579 B2
(45) Date of Patent: Apr. 25, 2023

(54) INFORMATION PROCESSING METHOD, INFORMATION PROCESSING APPARATUS AND COMPUTER-READABLE RECORDING MEDIUM

(71) Applicant: Tokyo Electron Limited, Tokyo (JP)

(72) Inventors: Toyohisa Tsuruda, Koshi (JP); Masato Hosaka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 80 days.

(21) Appl. No.: 17/178,778

(22) Filed: Feb. 18, 2021

(65) Prior Publication Data

US 2021/0256666 A1   Aug. 19, 2021

(30) Foreign Application Priority Data

Feb. 19, 2020 (JP) .............................. JP2020-026025
Dec. 21, 2020 (JP) .............................. JP2020-211667

(51) Int. Cl.
*G06T 5/00* (2006.01)
*G06T 3/00* (2006.01)

(52) U.S. Cl.
CPC ............ *G06T 5/006* (2013.01); *G06T 3/0093* (2013.01); *G06T 5/001* (2013.01)

(58) Field of Classification Search
CPC ....... G06T 5/006; G06T 3/0093; G06T 5/001; G06T 7/0004; G06T 2207/30148; G01B 11/028; G01B 11/306; G01B 11/16; H01L 21/67178; H01L 21/67288; H01L 21/68764

See application file for complete search history.

(56) References Cited

U.S. PATENT DOCUMENTS

| | | | |
|---|---|---|---|
| 2015/0324970 A1* | 11/2015 | Iwanaga ................... G06T 7/60 | 382/145 |
| 2016/0062113 A1* | 3/2016 | El-Ghoroury ........ G09G 3/3413 | 345/647 |
| 2017/0243738 A1* | 8/2017 | Noda ..................... G03F 7/2028 |
| 2017/0244936 A1* | 8/2017 | Koga ................... H04N 5/2256 |
| 2020/0096321 A1* | 3/2020 | Hisano .............. H01L 21/67288 |
| 2022/0195089 A1* | 6/2022 | Imamura ................. B05C 11/08 |

FOREIGN PATENT DOCUMENTS

JP   2015-215193 A   12/2015

* cited by examiner

*Primary Examiner* — Charles T Shedrick
(74) *Attorney, Agent, or Firm* — Nath, Goldberg & Meyer; Jerald L. Meyer; Tanya E. Harkins

(57) ABSTRACT

An information processing method includes obtaining information on a deformation factor of a surface of a target substrate; obtaining a surface image of the target substrate; calculating a correction coefficient for correcting an image change due to deformation of the surface, based on the information on the deformation factor of the surface; and generating a corrected image of the target substrate by correcting the surface image of the target substrate using the correction coefficient.

15 Claims, 25 Drawing Sheets

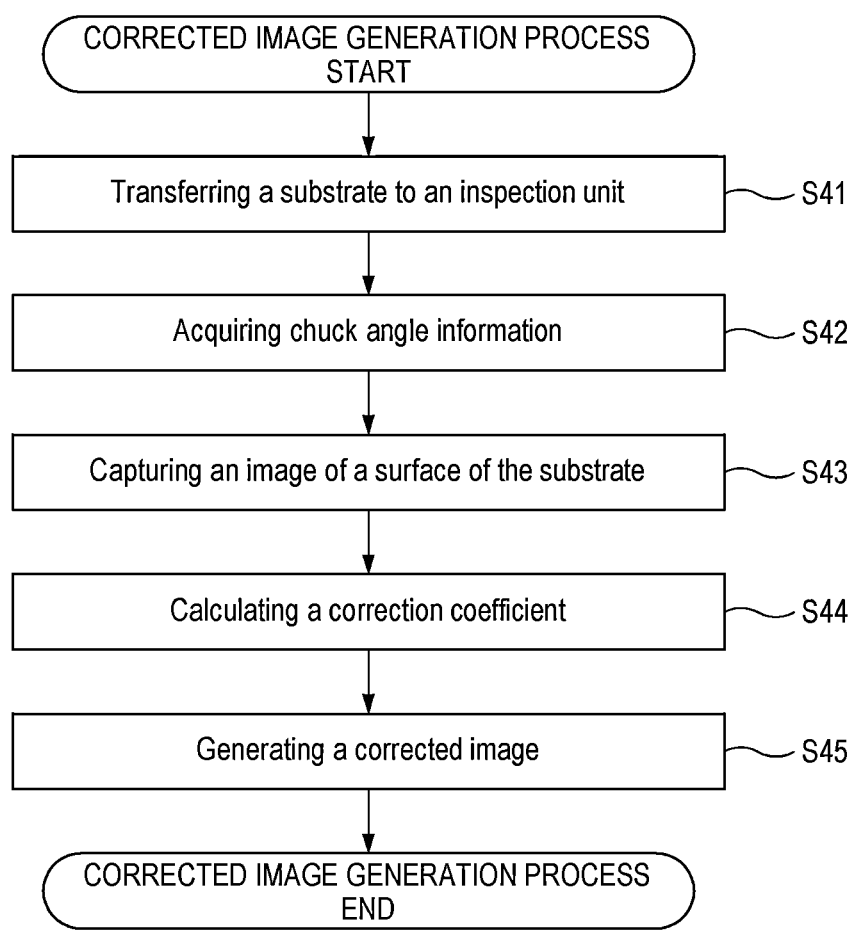

INFORMATION PROCESSING METHOD, INFORMATION PROCESSING APPARATUS AND COMPUTER-READABLE RECORDING MEDIUM

CROSS-REFERENCE TO RELATED APPLICATION

This application is based upon and claims the benefit of priority from Japanese Patent Application No. 2020-026025, filed on Feb. 19, 2020 and Japanese Patent Application No. 2020-211667, filed on Dec. 21, 2020, the entire contents of which are incorporated herein by reference.

TECHNICAL FIELD

The present disclosure relates to an information processing method, an information processing apparatus and a computer-readable recording medium.

BACKGROUND

Patent Document 1 discloses an apparatus for calculating a film thickness of a film formed on a substrate, based on a captured image of a surface of the substrate.

PRIOR ART DOCUMENT

Patent Document
Patent Document 1: Japanese Patent Application Publication No. 2015-215193

SUMMARY

According to one embodiment of the present disclosure, an information processing method includes: obtaining information on a deformation factor of a surface of a target substrate; obtaining a surface image of the target substrate; calculating a correction coefficient for correcting an image change due to deformation of the surface, based on the information on the deformation factor of the surface; and generating a corrected image of the target substrate by correcting the surface image of the target substrate using the correction coefficient.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 24 is a flowchart for explaining an example of a process for generating a corrected image.

DETAILED DESCRIPTION

Figure 1:
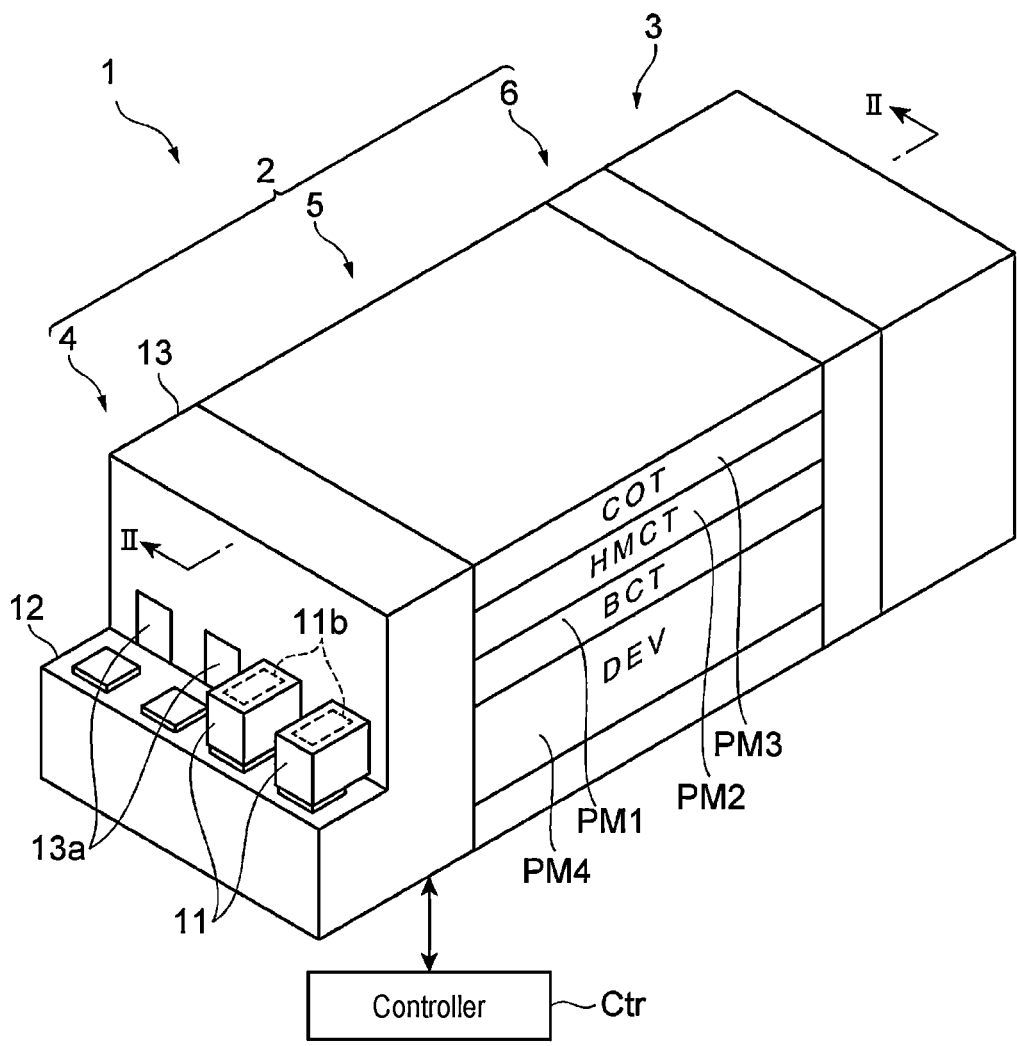
FIG. 1 illustrates a perspective view showing an example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In the following description, the same reference numerals will be used for the same elements or elements having the same function, and the redundant descriptions thereof will be omitted.

1. First Embodiment

[Substrate Processing System]

Figure 2:
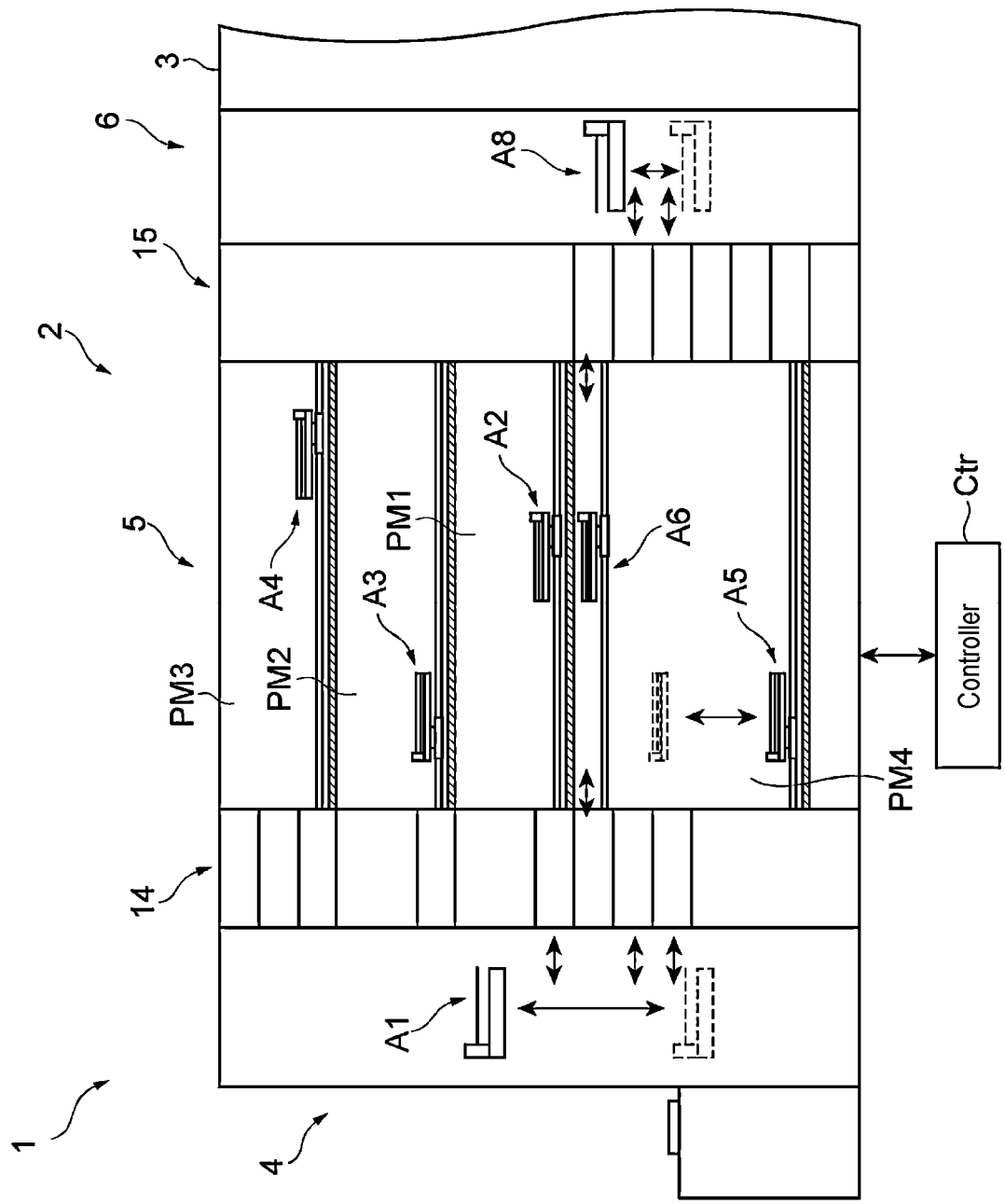
FIG. 2 illustrates a cross-sectional view taken along line II-II of FIG. 1.

As shown in FIGS. 1 and 2, the substrate processing system 1 includes a coating and development apparatus 2 (a substrate processing apparatus), an exposure apparatus 3, and a controller Ctr (information processing apparatus).

The exposure apparatus 3 is configured to transport a substrate W to and from the coating and development apparatus 2 and to perform an exposure process (pattern exposure) of a resist film (photosensitive film) formed on a front surface Wa (see FIG. 4 and the like) of the substrate W. The exposure apparatus 3 may selectively irradiate energy rays on an exposure target portion of the resist film by a method such as immersion exposure or the like.

The energy rays may be, for example, ionization radiation, non-ionization radiation, or the like. Ionization radiation is radiation that has sufficient energy to ionize atoms or molecules. The ionization radiation may be, for example, extreme ultraviolet (EUV) rays, electron rays, an ion beam, X-rays, α-rays, β-rays, γ-rays, heavy particle rays, proton rays and the like. Non-ionization radiation is radiation that does not have enough energy to ionize atoms or molecules. The non-ionization radiation may be, for example, g-rays, i-rays, a KrF excimer laser, an ArF excimer laser, an $F_2$ excimer laser and the like.

The coating and development apparatus 2 is configured to form a resist film on the front surface Wa of the substrate W before an exposure process performed by the exposure apparatus 3. The coating and development apparatus 2 is configured to perform a developing process with respect to the resist film after the exposure process.

The substrate W may have a disc shape or may have a plate shape other than a circular shape, such as a polygonal shape or the like. The substrate W may have a cutout portion formed by partially cutting out the same. The cutout portion may be, for example, a notch (a groove having a U-shape, a V-shape, or the like) or may be a straight portion (so-called an orientation flat) extending linearly. The substrate W may be, for example, a semiconductor substrate, a glass substrate, a mask substrate, an FPD (Flat Panel Display) substrate, or various other substrates. The diameter of the substrate W may be, for example, about 200 mm to 450 mm.

Figure 3:
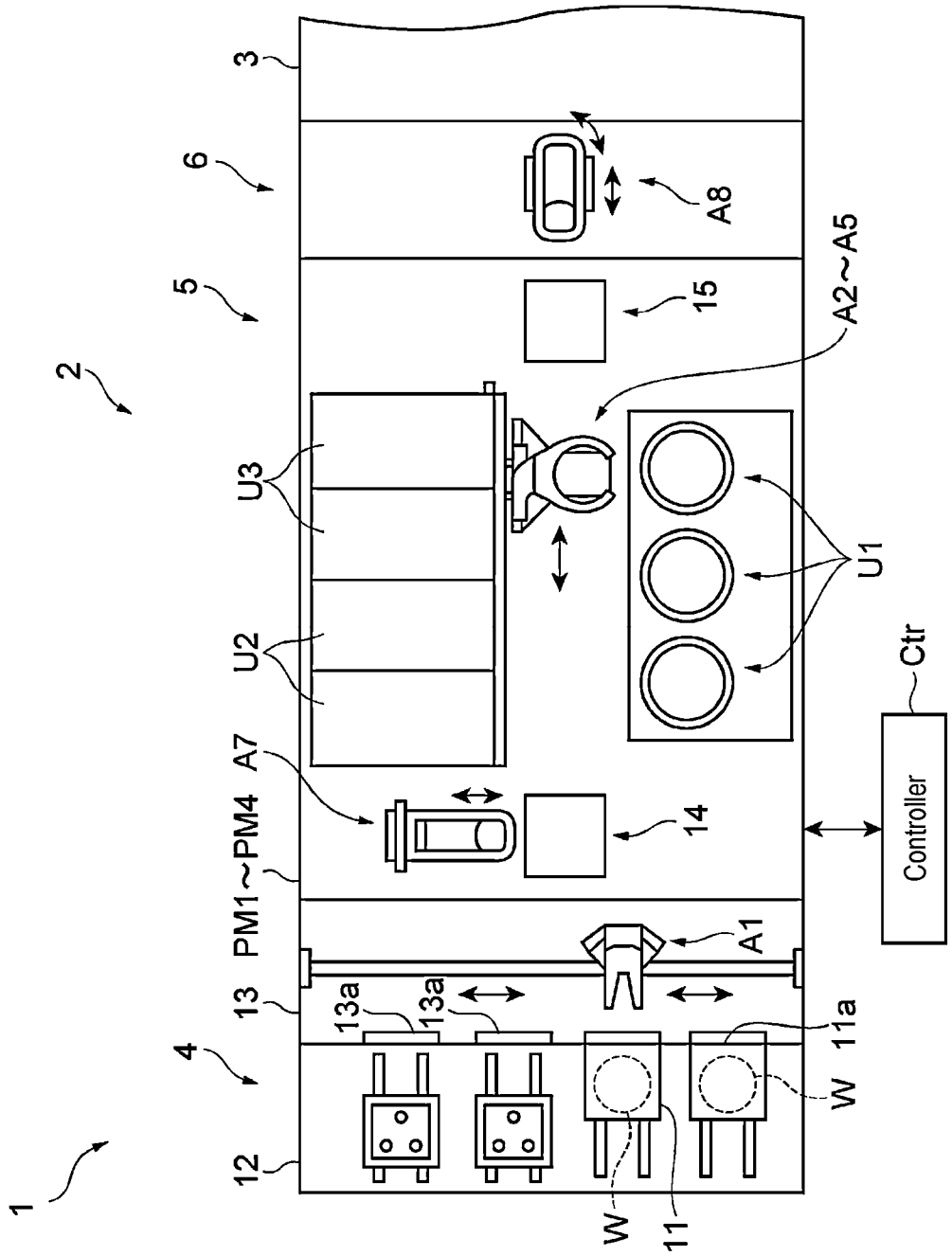
FIG. 3 illustrates a top view showing an example of a processing module.

As shown in FIGS. 1 to 3, the coating and development apparatus 2 includes a carrier block 4, a processing block 5 and an interface block 6. The carrier block 4, the processing block 5 and the interface block 6 are arranged side by side in the horizontal direction.

As shown in FIGS. 1 and 3, the carrier block 4 includes a carrier station 12 and a loading/unloading unit 13. The carrier station 12 supports multiple carriers 11. Each carrier 11 accommodates at least one substrate W in a sealed state. An opening/closing door (not shown) for taking in and out the substrate W therethrough is provided on a side surface 11a of the carrier 11. The carrier 11 is detachably installed on the carrier station 12 so that the side surface 11a faces the side of the loading/unloading unit 13.

The loading/unloading unit 13 is located between the carrier station 12 and the processing block 5. The loading/unloading unit 13 includes multiple opening/closing doors 13a. When the carrier 11 is placed on the carrier station 12, the opening/closing door of the carrier 11 comes into a state in which it faces the opening/closing door 13a. By opening the opening/closing door 13a and the opening/closing door of the side surface 11a at the same time, the inside of the carrier 11 and the inside of the loading/unloading unit 13 communicate with each other. The loading/unloading unit 13 includes a transport arm A1 arranged therein. The transport arm A1 is configured to take out the substrate W from the carrier 11 and deliver it to the processing block 5, and is configured to receive the substrate W from the processing block 5 and return it into the carrier 11.

The processing block 5 includes processing modules PM1 to PM4 as shown in FIGS. 1 to 3. For example, these processing modules may be arranged in the order of the processing module PM4, the processing module PM1, the processing module PM2, and the processing module PM3 from the floor surface side. As shown in FIG. 3, the processing modules PM1 to PM4 include liquid treatment units U1, heat treatment units U2, and inspection units U3. Details of the inspection unit U3 will be described later.

The processing module PM1 is configured to form a lower layer film on the surface of the substrate W, and is also called a BCT module. As shown in FIGS. 2 and 3, the processing module PM1 includes units U1 to U3 and a transport arm A2 for transferring the substrate W to the units U1 to U3. For example, the liquid treatment unit U1 of the processing module PM1 is configured to apply a coating liquid for forming a lower layer film to the substrate W. As an example, the heat treatment unit U2 of the processing module PM1 is configured to perform heat treatment for curing the coating film formed on the substrate W by the liquid treatment unit U1 to form a lower layer film. The lower layer film may include, for example, an antireflection (SiARC) film.

The processing module PM2 is configured to form an intermediate layer film (hard mask) on the lower layer film, and is also called an HMCT module. As shown in FIGS. 2 and 3, the processing module PM2 includes units U1 to U3 and a transport arm A3 that transfers the substrate W to the units U1 to U3. For example, the liquid treatment unit U1 of the processing module PM2 is configured to apply a coating liquid for forming an intermediate layer film to the substrate W. The heat treatment unit U2 of the processing module PM2 is configured to perform heat treatment for curing the coating film formed on the substrate W by the liquid treatment unit U1 to form the intermediate layer film. The intermediate layer film may include, for example, an SOC (Spin-On-Carbon) film and an amorphous carbon film.

The processing module PM3 is configured to form a thermosetting photosensitive resist film on the intermediate layer film, and is also called a COT module. As shown in FIGS. 2 and 3, the processing module PM3 includes units U1 to U3 and a transport arm A4 for transferring the substrate W to the units U1 to U3. For example, the liquid treatment unit U1 of the processing module PM3 is configured to apply a coating liquid for forming a resist film to the substrate W. For example, the heat treatment unit U2 of the processing module PM3 is configured to perform heat treatment (PAB: Pre-Applied Bake) for curing the coating film formed on the substrate W by the liquid treatment unit U1 to form a resist film.

The processing module PM4 is configured to perform a development process for the exposed resist film, and is also called a DEV module. As shown in FIGS. 2 and 3, the processing module PM4 includes units U1 to U3 and a transport arm A5 that transfers the substrate W to the units U1 to U3. The processing module PM4 includes a transport arm A6 that directly transports the substrate W between shelf units 14 and 15 without passing through the units U1 to U3. For example, the liquid treatment unit U1 of the treatment module PM4 is configured to partially remove the resist film to form a resist pattern. For example, the heat treatment unit U2 of the processing module PM4 is configured to perform heat treatment before a development process (PEB: Post Exposure Bake), heat treatment after a development process (PB: Post Bake), and the like.

As shown in FIGS. 2 and 3, the processing block 5 includes a shelf unit 14 located on the side of the carrier block 4. The shelf unit 14 is provided from the floor surface to the processing module PM3, and is divided into a plurality of cells arranged in the vertical direction. A transport arm A7 is provided in the vicinity of the shelf unit 14. The transport arm A7 raises and lowers the substrate W between the cells of the shelf unit 14.

The processing block 5 includes a shelf unit 15 located in the interface block 6. The shelf unit 15 is provided from the floor surface to the upper portion of the processing module PM4, and is divided into a plurality of cells arranged in the vertical direction.

The interface block 6 includes a transport arm A8 and is connected to the exposure apparatus 3. The transport arm A8 is configured to take out the substrate W of the shelf unit 15 and pass it to the exposure apparatus 3, and is configured to receive the substrate W from the exposure apparatus 3 and return it to the shelf unit 15.

The controller Ctr is configured to partially or wholly control the coating and development apparatus 2. Details of the controller Ctr will be described later. The controller Ctr may be configured to send and receive signals to and from a controller of the exposure apparatus 3 and to entirely control the substrate processing system 1 in connection with the controller of the exposure apparatus 3.

[Configuration of Inspection Unit]

Figure 4:
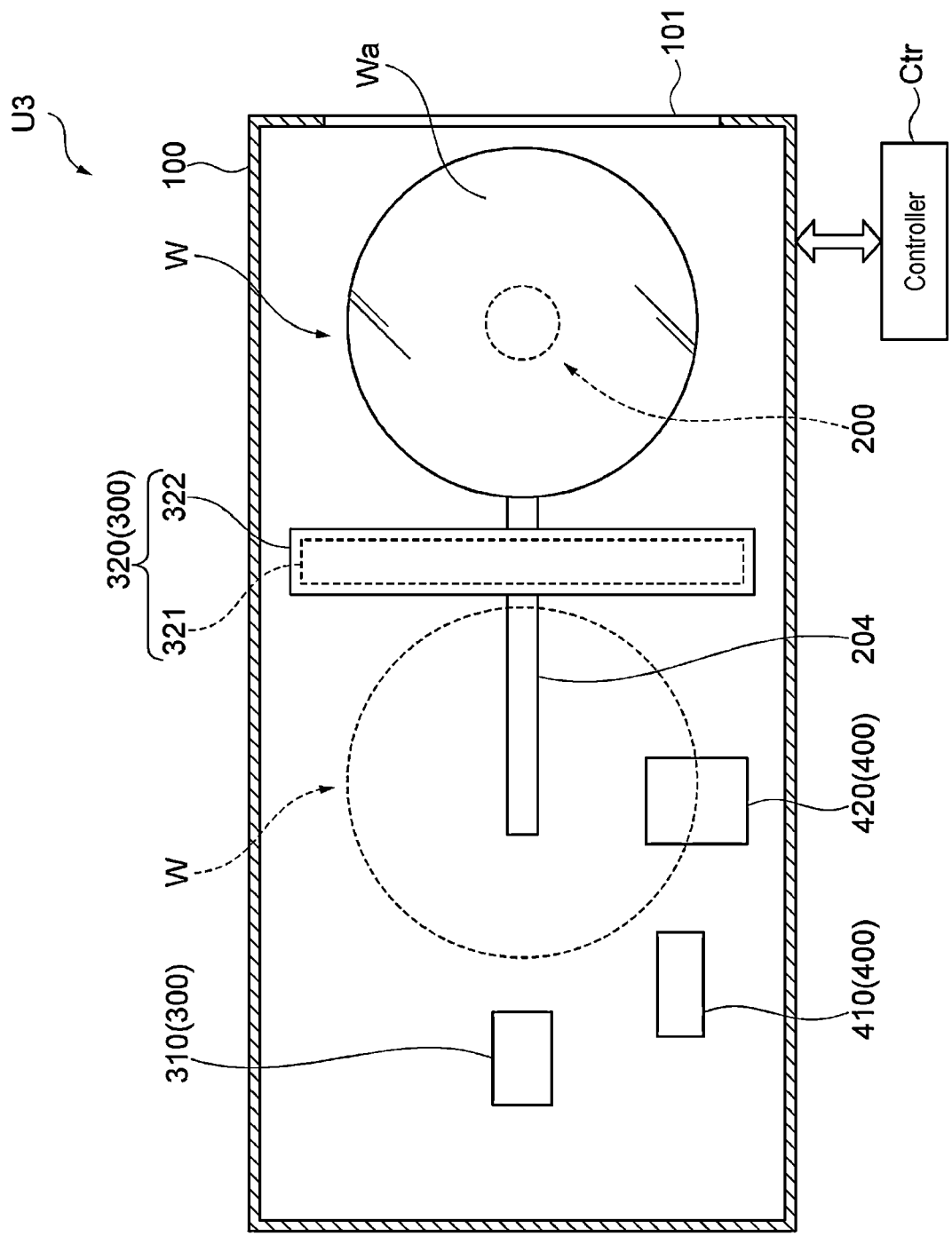
FIG. 4 illustrates a cross-sectional view of an example of an inspection unit as viewed from above.
Figure 5:
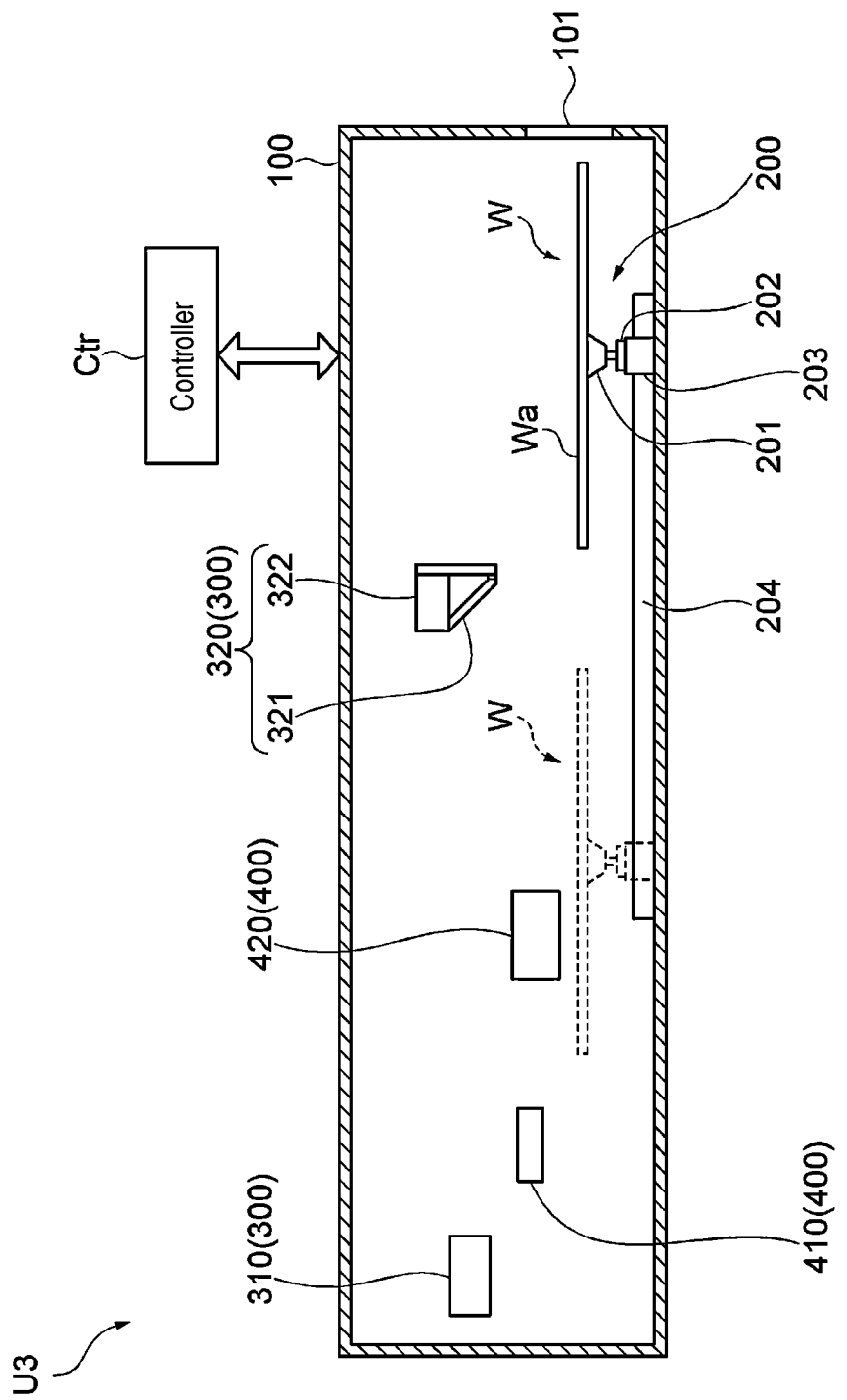
FIG. 5 illustrates a cross-sectional view of an example of the inspection unit as viewed from a lateral side.
Figure 6:
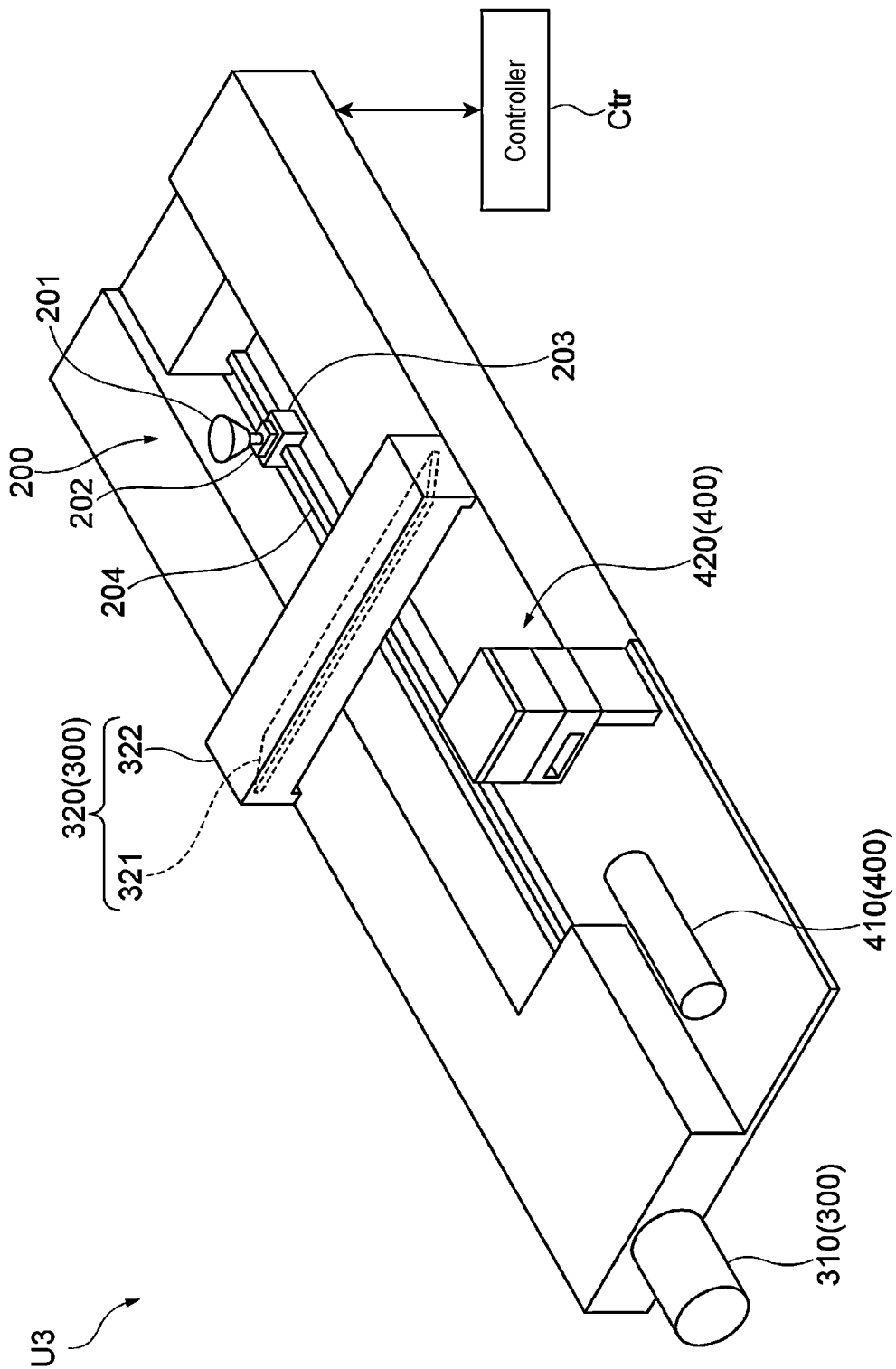
FIG. 6 illustrates a perspective view showing an example of the inspection unit.

Subsequently, the inspection unit U3 will be described in more detail with reference to FIGS. 4 to 13. As shown in FIGS. 4 to 6, the inspection unit U3 includes a housing 100, a rotary holding unit 200 (substrate holder), a surface imaging unit 300, and an edge imaging unit 400. Each of the units 200 to 400 is arranged in the housing 100. As shown in FIGS. 4 and 5, on one end wall of the housing 100, a loading/unloading port 101 is formed for loading the substrate W into the housing 100 and unloading the substrate W to the outside of the housing 100.

As shown in FIGS. 5 and 6, the rotary holding unit 200 includes a holding support 201, actuators 202 and 203, and a guide rail 204. The holding support 201 is, for example, an attraction chuck that holds the substrate W substantially horizontally by suction or the like. The shape of the holding support 201 (attraction chuck) is not particularly limited, but may be, for example, a circular shape. The size of the holding support 201 may be smaller than that of the substrate W. When the holding support 201 has a circular shape, the size of the holding support 201 may be, for example, about 80 mm in diameter.

The actuator 202 is, for example, an electric motor, and rotationally drives the holding support 201. The actuator 202 is configured to rotate the substrate W held by the holding support 201. The actuator 202 may include an encoder for detecting the rotational position of the holding support 201. In this case, the imaging position of each surface of the substrate W by the respective units 300 and 400, and the rotation position may be correlated. When the substrate W has a cutout portion, the posture of the substrate W can be specified based on the cutout portion determined by the units 300 and 400 and the rotation position detected by the encoder.

The actuator 203 is, for example, a linear actuator, and moves the holding support 201 along the guide rail 204. The actuator 203 is configured to transport the substrate W held by the holding support 201 between one end side and the other end side of the guide rail 204. Therefore, the substrate W held by the holding support 201 can be moved between a first position near the loading/unloading port 101 and a second position near the edge imaging unit 400. The guide rail 204 extends linearly (e.g., along a straight line, a curved line, etc.) in the housing 100.

The surface imaging unit 300 includes a camera 310 and a lighting module 320, as shown in FIGS. 5 and 6. The camera 310 and the lighting module 320 constitute a set of imaging modules. The camera 310 includes a lens and one imaging element (e.g., a CCD image sensor, a CMOS image sensor, etc.). The camera 310 faces the lighting module 320.

The lighting module 320 includes a half mirror 321 and a light source 322. The half mirror 321 is arranged in the housing 100 in a state in which it is inclined by about 45° with respect to the horizontal direction. The half mirror 321 is located above an intermediate portion of the guide rail 204 so as to intersect the extension direction of the guide rail 204 when viewed from above. The half mirror 321 has a rectangular shape. The length of the half mirror 321 is larger than the diameter of the substrate W.

The light source 322 is located above the half mirror 321. The light source 322 is longer than the half mirror 321. The light emitted from the light source 322 passes through the half mirror 321 as a whole and is irradiated downward (toward the guide rail 204). The light that has passed through the half mirror 321 is reflected by an object located below the half mirror 321 and then reflected again by the half mirror 321. Then, the light passes through the lens of the camera 310 and is incident on the imaging element of the camera 310. That is, the camera 310 can capture an image of an object that exists in the irradiation region of the light source 322 via the half mirror 321. For example, when the holding support 201 holding the substrate W is moved along the guide rail 204 by the actuator 203, the camera 310 can image the front surface Wa of the substrate W passing through the irradiation region of the light source 322. The data of the image captured by the camera 310 is transmitted to the controller Ctr.

The edge imaging unit 400 includes a camera 410, a lighting module 420 and a mirror member 430, as shown in FIGS. 7 to 10. The camera 410, the lighting module 420 and the mirror member 430 constitute a set of imaging modules. The camera 410 includes a lens 411 and one imaging element 412 (e.g., a CCD image sensor, a CMOS image sensor, etc.). The camera 410 faces the lighting module 420.

The lighting module 420 is disposed above the substrate W held by the holding support 201, as shown in FIGS. 7 to 10. The lighting module 420 includes a light source 421, a light scattering member 422 and a holding member 423. The light source 421 may be composed of, for example, a plurality of LED point light sources 421*b* (see FIG. 10).

Figure 8:
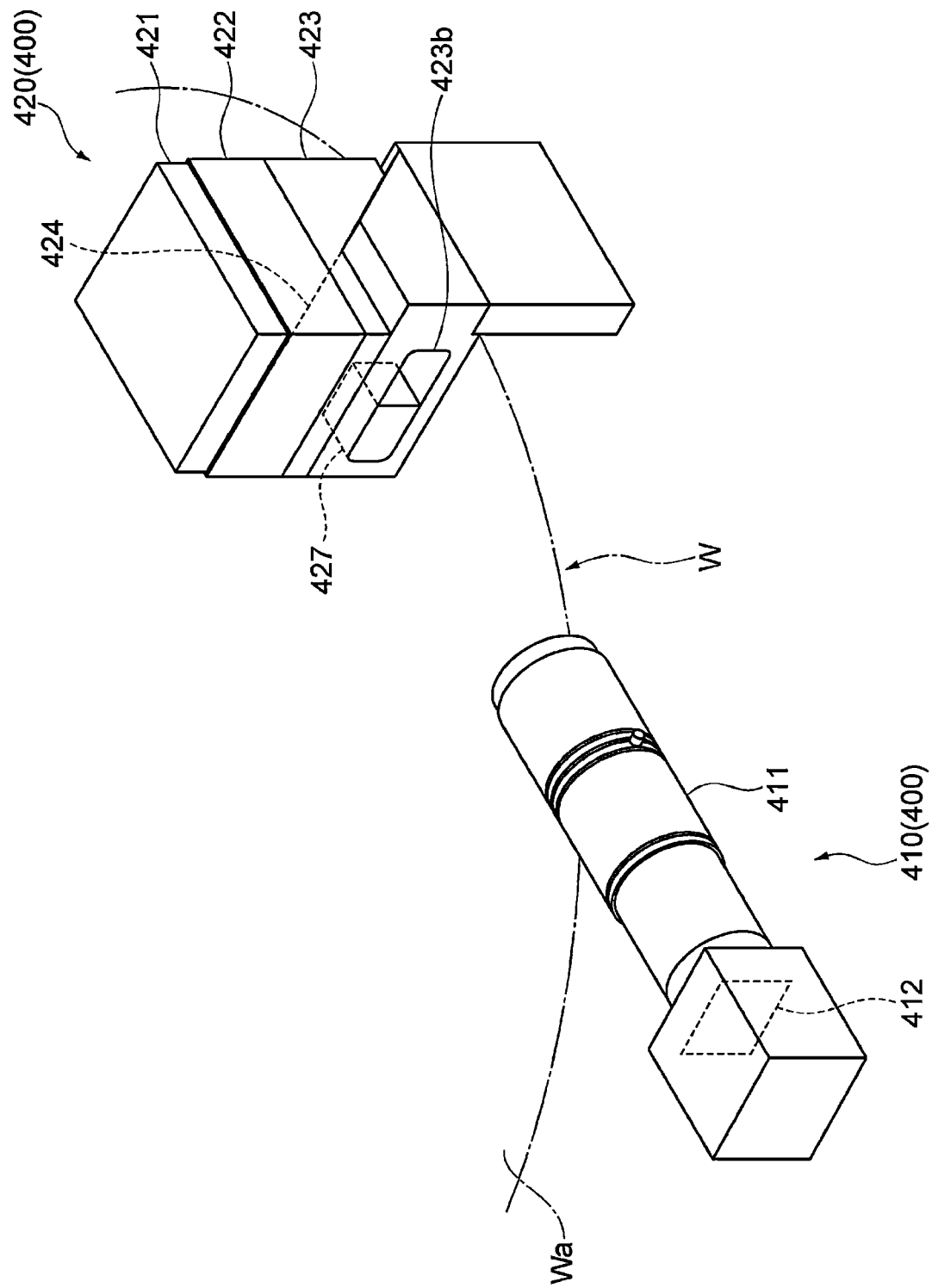
FIG. 8 illustrates a perspective view of an example of the edge imaging subunit as viewed from the rear side.
Figure 9:
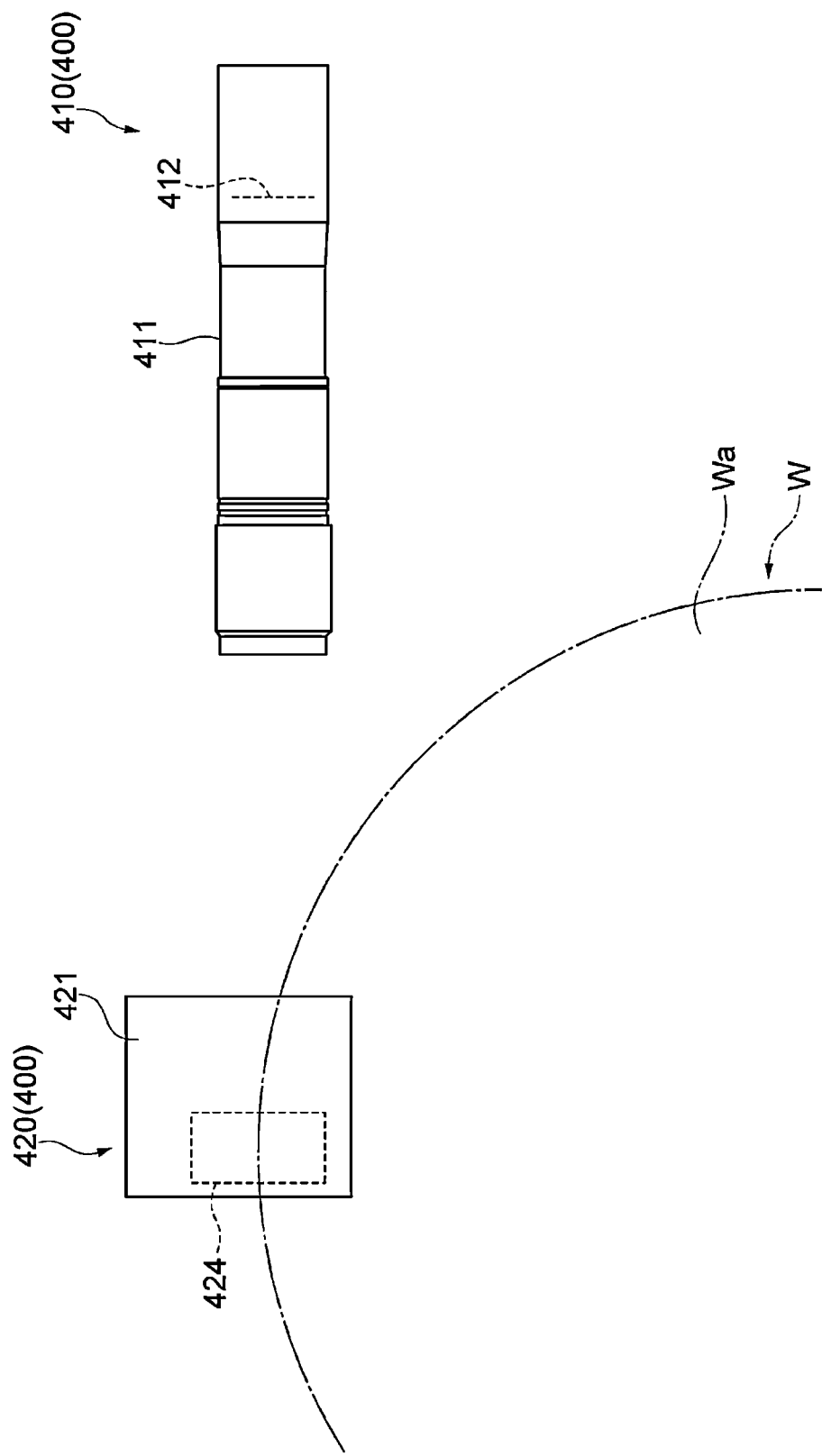
FIG. 9 illustrates a top view showing an example of the edge imaging subunit.
Figure 10:
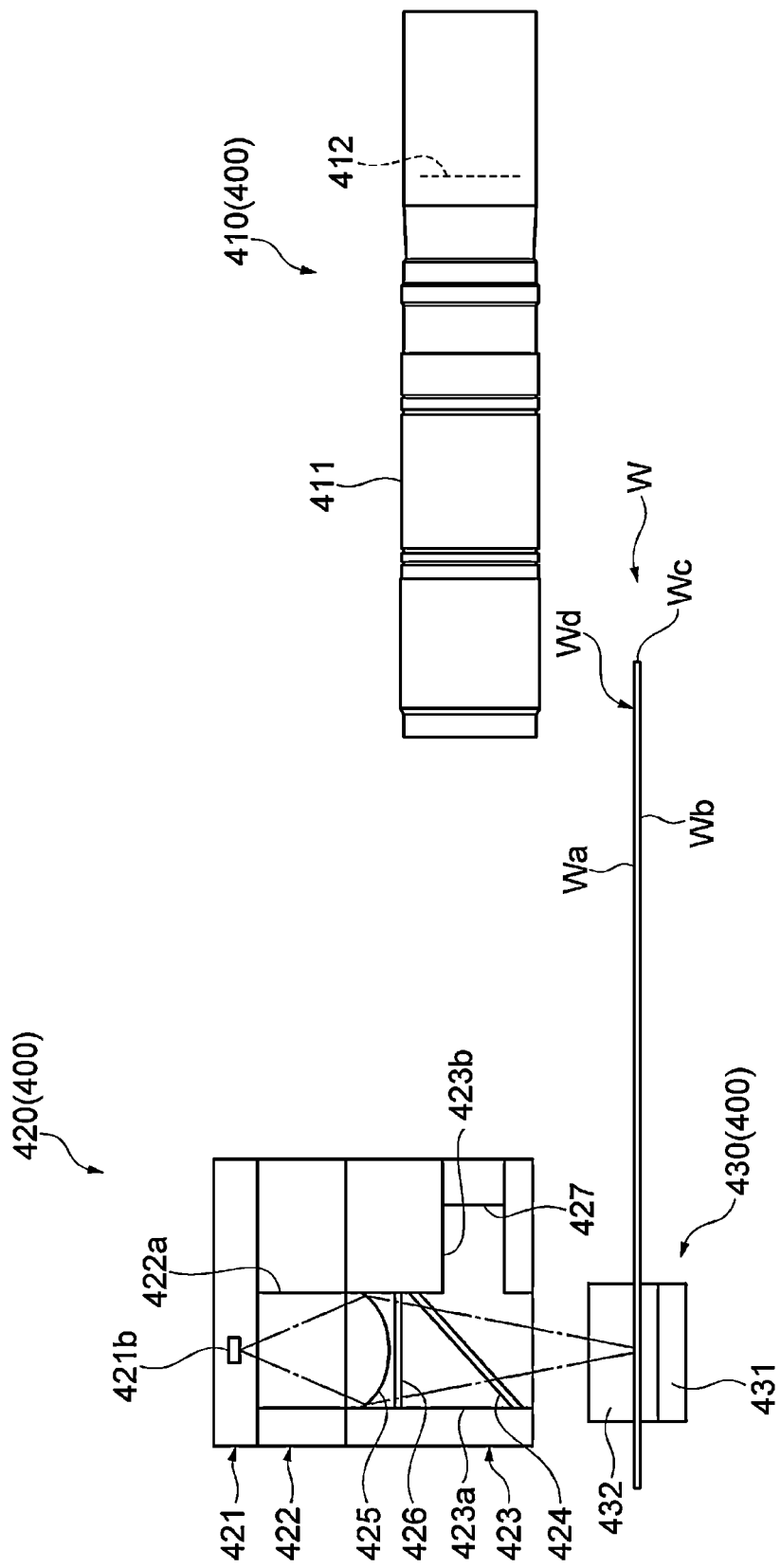
FIG. 10 illustrates a side view showing an example of the edge imaging subunit.
Figure 11:
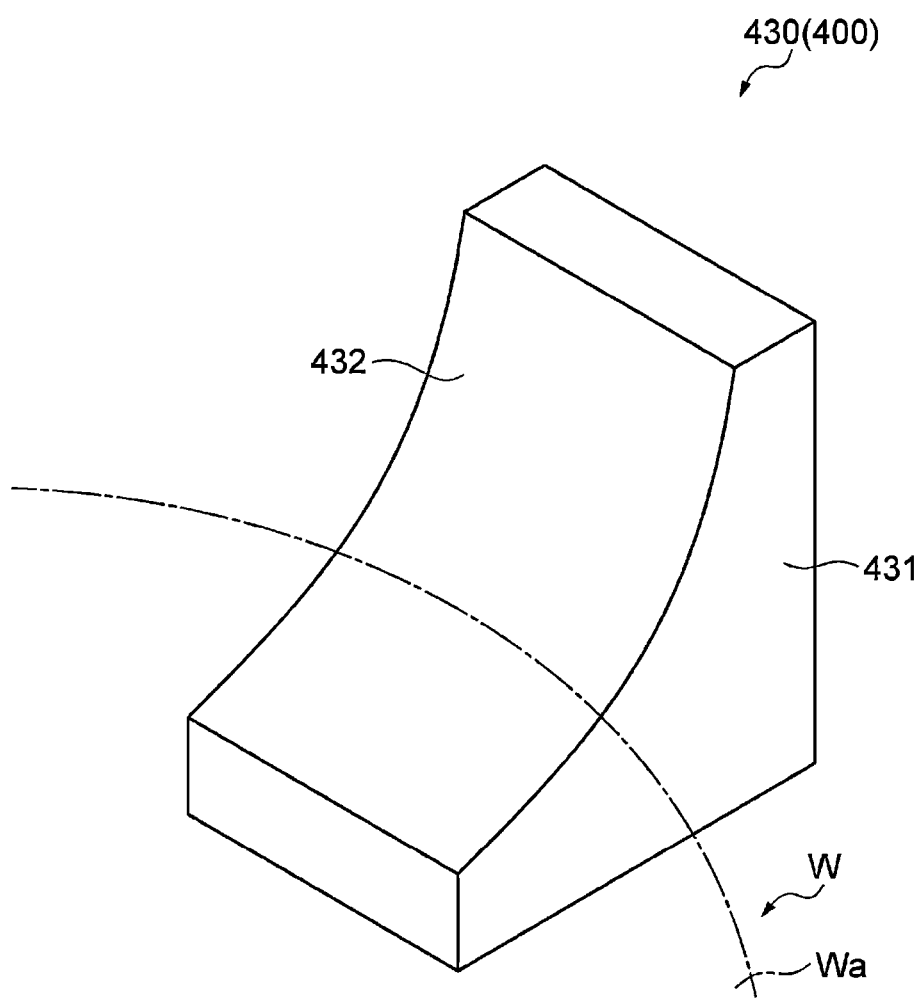
FIG. 11 illustrates a perspective view showing an example of a mirror member.

The holding member 423 holds a half mirror 424, a cylindrical lens 425, a light diffusing member 426 and a focus adjustment lens 427 therein. As shown in FIGS. 8 and 10, the half mirror 424 is disposed at an inclination of approximately 45° with respect to the horizontal direction, and at a location where a through-hole 423*a* and an intersection hole 423*b* intersect. The half mirror 424 has a rectangular shape.

The focus adjustment lens 427 is disposed in the intersection hole 423*b*. The focus adjustment lens 427 is not particularly limited as long as it is a lens having a function of changing the focal length thereof combined with the focal length of the lens 411. The focus adjustment lens 427 is, for example, a lens having a rectangular parallelepiped shape.

Figure 7:
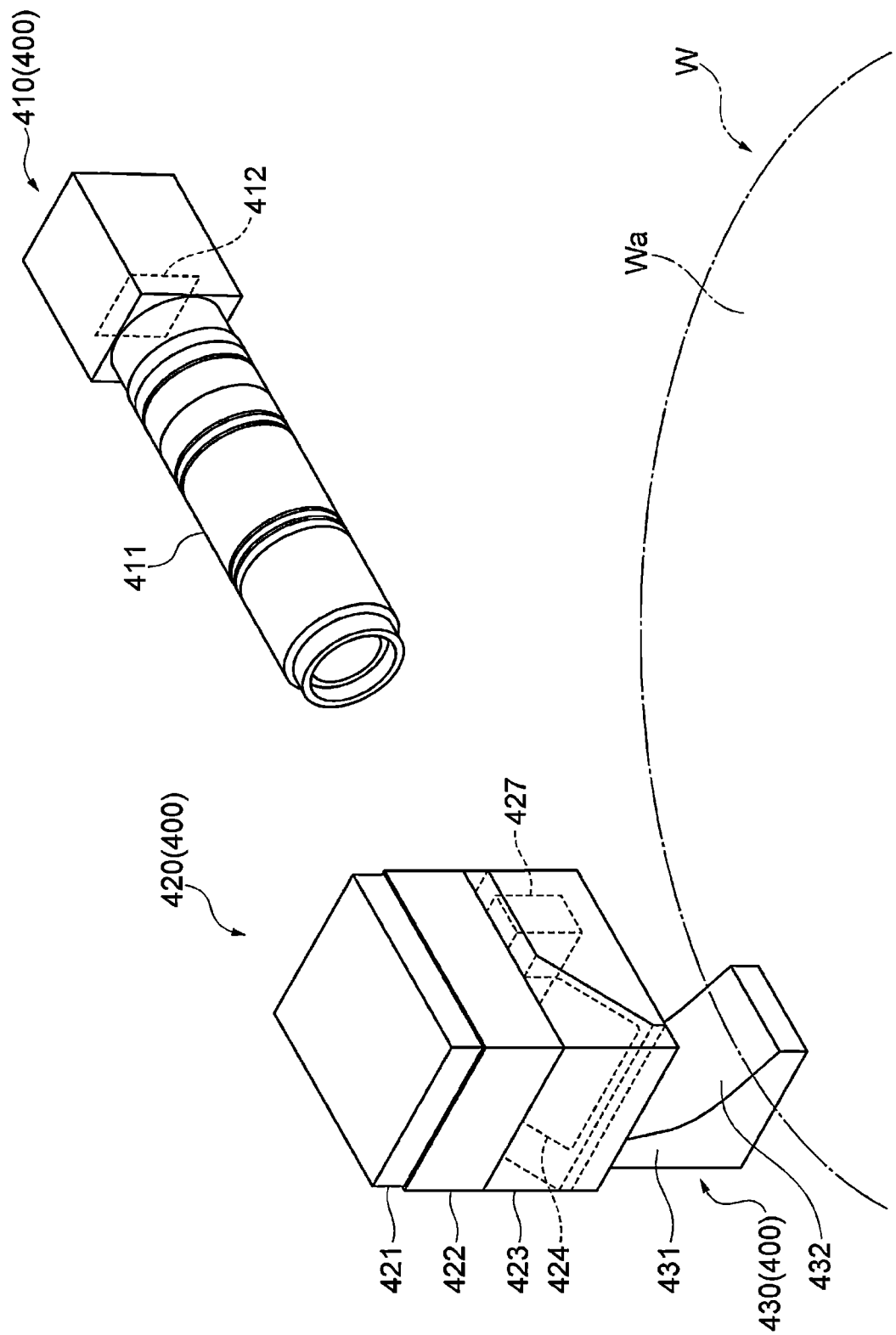
FIG. 7 illustrates a perspective view of an example of an edge imaging subunit as viewed from the front side.

The mirror member 430 is disposed under the lighting module 420, as shown in FIGS. 7 and 10. The mirror member 430 includes a main body 431 and a reflection surface 432, as shown in FIG. 7 and FIGS. 10 to 12. The main body 431 is composed of an aluminum block.

Figure 12:
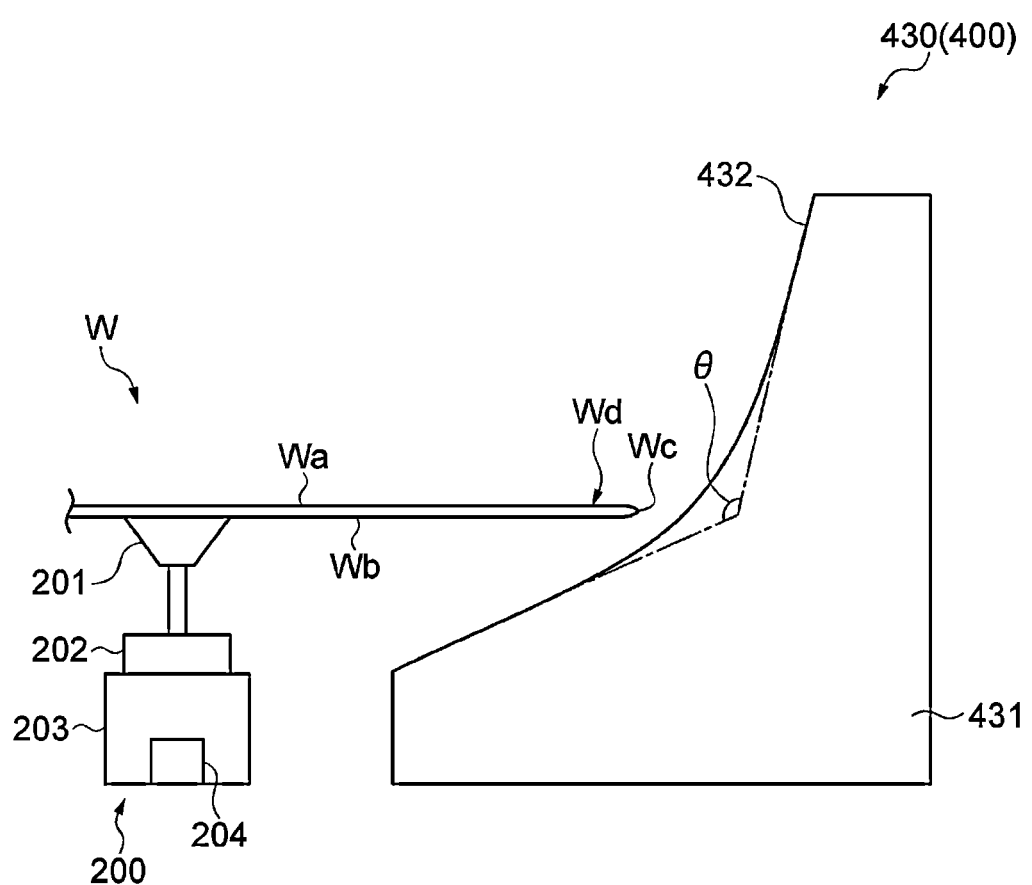
FIG. 12 illustrates a side view showing an example of the mirror member.

As shown in FIG. 12, when the substrate W held by the holding support 201 is in the second position inside the housing 100, the reflection surface 432 faces an edge surface We and a peripheral edge region Wd of a back surface Wb of the substrate W held by the holding support 201. The reflection surface 432 is inclined with respect to the rotation axis of the holding support 201. The reflection surface 432 is mirror-finished. For example, a mirror sheet may be attached to the reflection surface 432, aluminum plating may be applied to the reflection surface 432, or an aluminum material may be vapor-deposited on the reflection surface 432.

The reflection surface 432 is a curved surface recessed away from the edge surface We of the substrate W held by the holding support 201. That is, the mirror member 430 is a concave mirror. Therefore, when the edge surface We of the substrate W is projected on the reflection surface 432, the mirror image thereof is magnified more than the real image. The radius of curvature of the reflection surface 432 may be, for example, about 10 mm to 30 mm. The opening angle θ (see FIG. 12) of the reflection surface 432 may be about 1000 to 150°. The opening angle θ of the reflection surface 432 refers to an angle formed by two planes circumscribing the reflection surface 432.

Figure 13A:
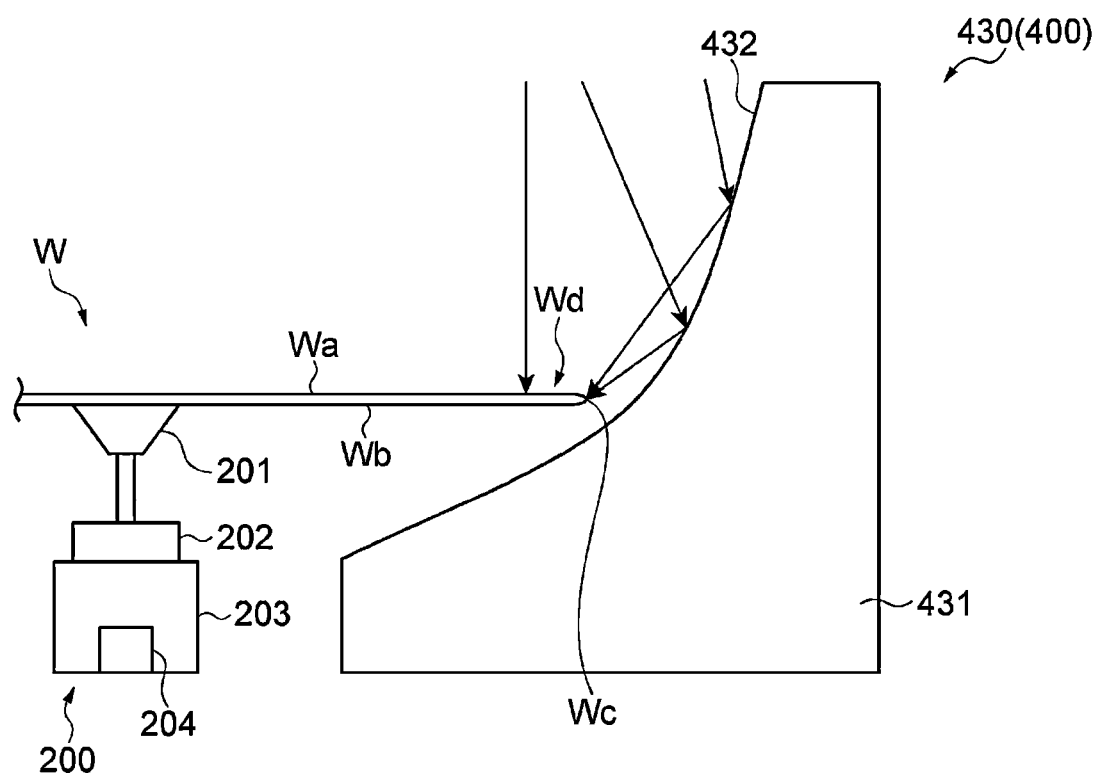
FIG. 13A is a diagram for explaining a state in which light from a lighting module is reflected by a mirror member.
Figure 13B:
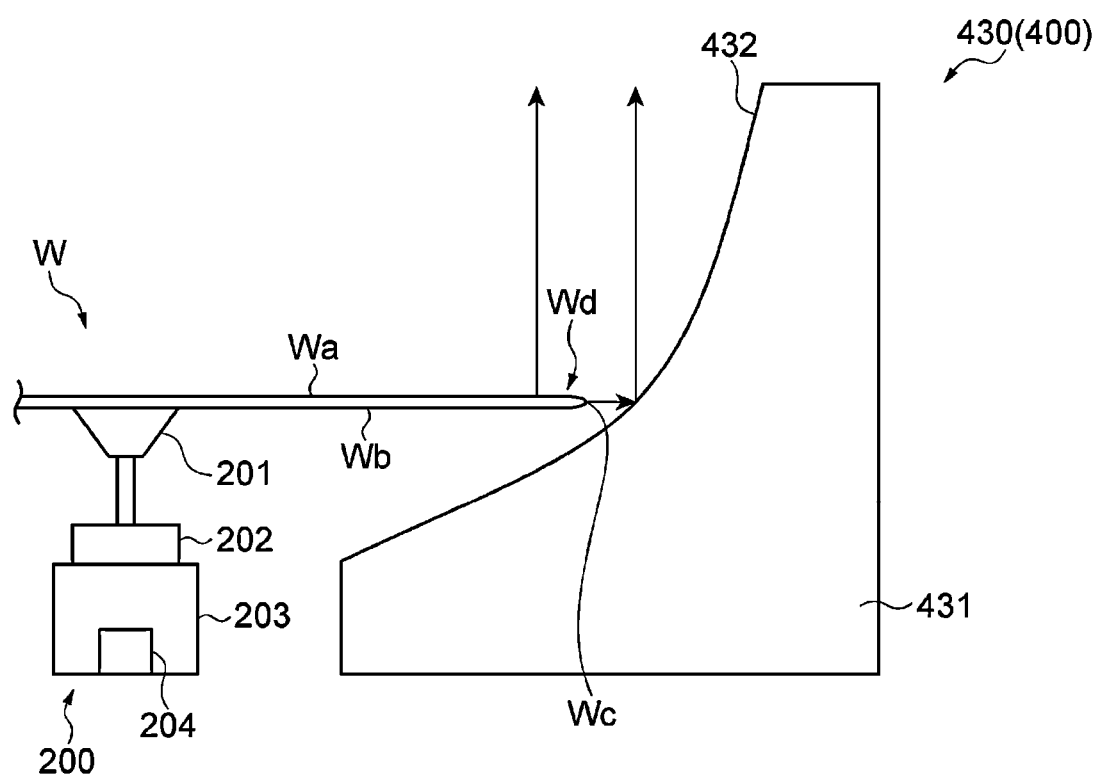
FIG. 13B is a diagram for explaining a state in which light from a substrate is reflected by the mirror member.

In the lighting module 420, the light emitted from the light source 421 is scattered by the light scattering member 422, magnified by the cylindrical lens 425, diffused by the light diffusing member 426, and then irradiated downward by passing through the half mirror 424 as a whole. The diffused light that has passed through the half mirror 424 is reflected by the reflection surface 432 of the mirror member 430 located below the half mirror 424. When the substrate W held by the holding support 201 is located in the second position, the light reflected by the reflection surface 432 is mainly irradiated on the edge surface We and the peripheral edge region Wd of the front surface Wa of the substrate W as shown in FIG. 13A.

The reflected light reflected from the peripheral edge region Wd of the front surface Wa of the substrate W is reflected again by the half mirror 424 without being directed to the reflection surface 432 of the mirror member 430 (see FIG. 13B), passes through the lens 411 of the camera 410 without passing through the focus adjustment lens 427, and is incident on the imaging element 412 of the camera 410. On the other hand, the reflected light reflected from the edge surface We of the substrate W is sequentially reflected by the reflection surface 432 of the mirror member 430 and the half mirror 424, sequentially passes through the focus adjustment lens 427 and the lens 411 of the camera 410, and is incident on the imaging element 412 of the camera 410. Therefore, the optical path length of the light reaching the imaging element 412 of the camera 410 from the edge surface We of the substrate W is longer than the optical path length of the light reaching the imaging element 412 of the camera 410 from the peripheral edge region Wd of the front surface Wa of the substrate W. The optical path difference between these optical paths may be, for example, about 1 mm to 10 mm. Accordingly, both the light from the peripheral edge region Wd of the front surface Wa of the substrate W and the light from the edge surface We of the substrate W are inputted to the imaging element 412 of the camera 410. That is, when the substrate W held by the holding support 201 is located at the second position inside the housing 100, the camera 410 can image both the peripheral edge region Wd of the front surface Wa of the substrate W and the edge surface We of the substrate W. The data of the captured image captured by the camera 410 is transmitted to the controller Ctr.

[Configuration of Controller]

The controller Ctr controls the inspection unit U3 so as to acquire image information of the front surface Wa of the substrate W as information representing the processing state of the front surface Wa of the substrate W. Here, the image information of the front surface Wa of the substrate W may be different depending on the processing state of the front surface Wa of the substrate W. Therefore, it is possible to identify the processing state of the front surface Wa of the substrate W based on the image information of the front surface Wa of the substrate W. However, deformation of the front surface Wa of the substrate W may also affect the image information of the front surface Wa of the substrate W. Thus, the controller Ctr is configured to execute an information processing method that includes: obtaining information on a deformation factor regarding deformation of a surface of a target substrate; obtaining a surface image of the target substrate; calculating a correction coefficient for correcting an image change due to the deformation of the surface, by using the information on the deformation factor; and generating a corrected image of the target substrate by correcting the surface image of the target substrate using the correction coefficient.

According to this information processing method, by calculating the correction coefficient based on the information on the deformation factor of the front surface and correcting the surface image of the target substrate using the correction coefficient, it is possible to easily remove the influence of the image change due to the deformation of the surface of the target substrate from the front surface image of the target substrate. Accordingly, the method is effective in evaluating the processing state of the front surface of the substrate with higher accuracy based on the surface image of the substrate. The deformation of the front surface Wa of the substrate W includes distortion of the front surface Wa and inclination of the entire front surface Wa. Specific examples of the deformation factor of the front surface Wa of the substrate W include warpage of the substrate W, deformation of the substrate W due to an uneven surface of the holding support 201, inclination of the substrate W due to inclination of the holding support 201, and the like.

Figure 14:
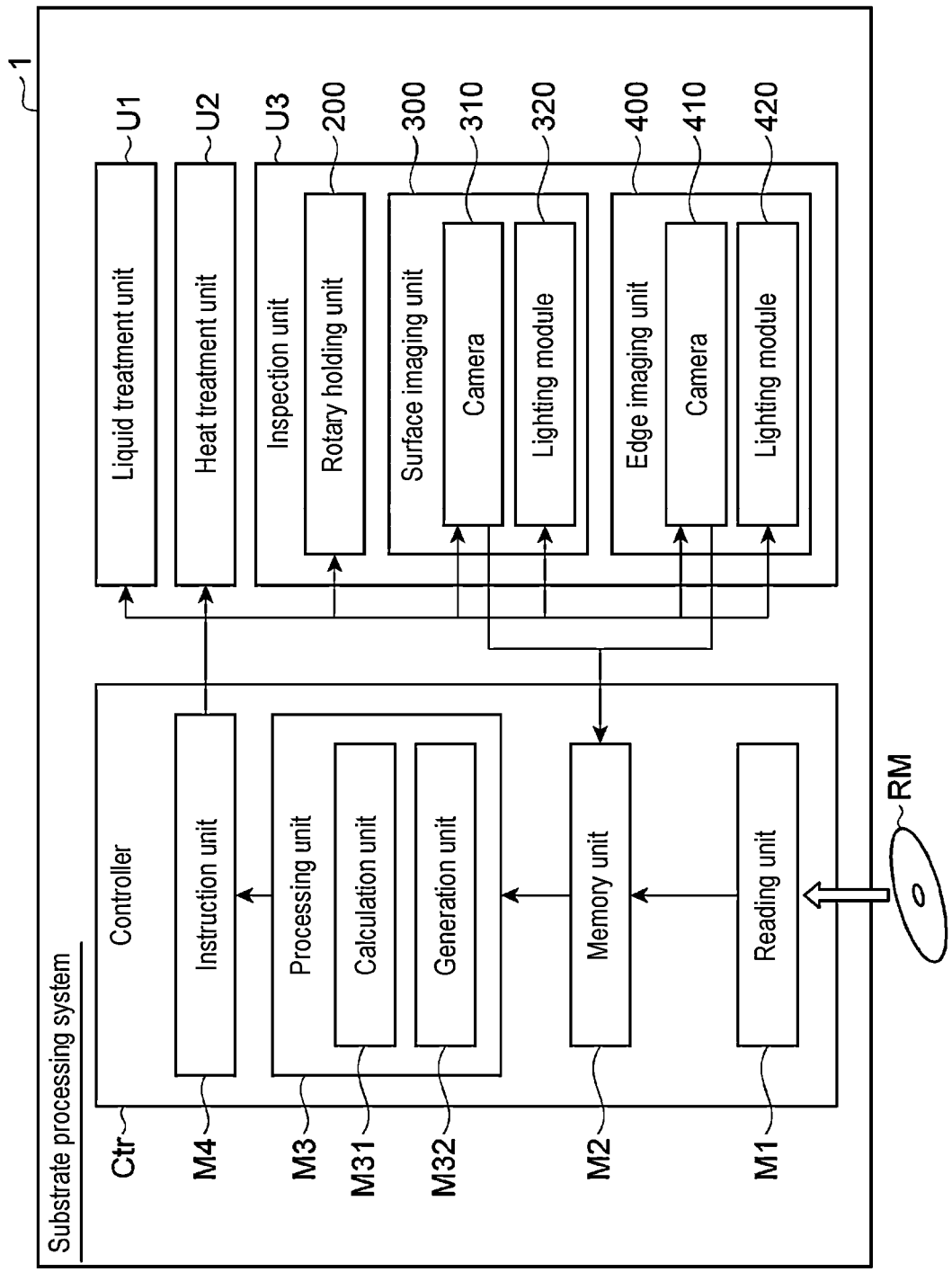
FIG. 14 is a block diagram showing an example of a main unit of a substrate processing system.

As shown in FIG. 14, the controller Ctr includes a reading unit M1, a memory unit M2, a processing unit M3 and an instruction unit M4 as functional modules. These functional modules merely divide the functions of the controller Ctr into a plurality of modules for the sake of convenience, and do not necessarily mean that the hardware constituting the controller Ctr is divided into such modules. Each functional module is not limited to being realized by executing a program, but may be realized by a dedicated electric circuit (e.g., a logic circuit) or an integrated circuit (ASIC: Application Specific Integrated Circuit) that integrates the dedicated electric circuit.

The reading unit M1 reads a program from a non-transitory computer-readable recording medium RM. The recording medium RM records a program for operating each unit of the coating and development apparatus 2. The recording medium RM may be, for example, a semiconductor memory, an optical recording disk, a magnetic recording disk, or a magneto-optical recording disk.

The memory unit M2 stores various data. The memory unit M2 stores, for example, the program read from the recording medium RM by the reading unit M1, the images (surface images) of the front surface Wa of the substrate W captured by the cameras 310 and 410, various kinds of information related to the substrate W (e.g., a warpage amount, a warpage coefficient, a correction coefficient, a corrected image, etc., the details of which will be described later), setting data inputted from an operator via an external input device (not shown), and the like.

The processing unit M3 processes various kinds of data. For example, the processing unit M3 may generate operation signals for operating the liquid treatment unit U1, the heat treatment unit U2, the holding support 201, the actuator 203, the cameras 310 and 410, the light sources 322 and 421, and the like, based on the various kinds of data stored in the memory unit M2. The processing unit M3 includes a calculation unit M31 and a generation unit M32 (the details of which will be described later).

The instruction unit M4 transmits the operation signals generated by the processing unit M3 to various devices.

Figure 15:
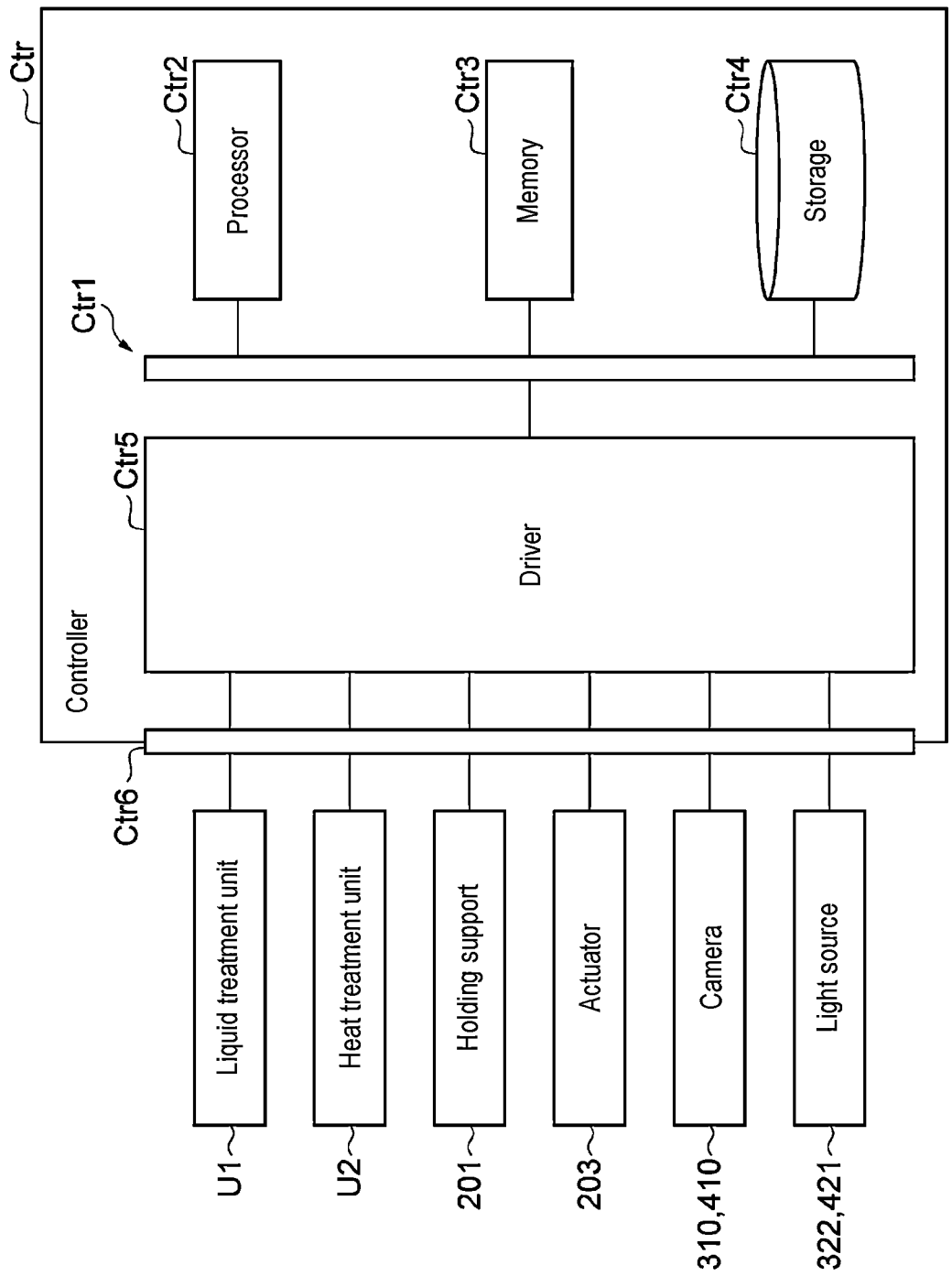
FIG. 15 illustrates a schematic view showing an example of a hardware configuration of a controller.

The hardware of the controller Ctr is composed of, for example, one or more control computers. The controller Ctr includes, for example, a circuit Ctr1 shown in FIG. 15 as a hardware configuration. The circuit Ctr1 may be composed of an electric circuit element (circuitry). Specifically, the circuit Ctr1 includes a processor Ctr2 (calculation unit and generation unit), a memory Ctr3 (memory unit), a storage Ctr4 (memory unit), a driver Ctr5, and an input/output port Ctr6.

The processor Ctr2 constitutes each of the above-mentioned functional modules by executing a program in cooperation with at least one of the memory Ctr3 and the storage Ctr4 and executing the input/output of signals via the input/output port Ctr6. The memory Ctr3 and the storage Ctr4 function as the memory unit M2. The driver Ctr5 is a circuit for driving various devices of the coating and development apparatus 2. The input/output port Ctr6 performs the input/output of signals between the driver Ctr5 and various devices of the coating and development apparatus 2 (e.g., the liquid treatment unit U1, the heat treatment unit U2, the holding support 201, the actuator 203, the cameras 310 and 410, the light sources 322 and 421, etc.).

The substrate processing system 1 may include one controller Ctr, or may include a controller group (control unit) composed of multiple controllers Ctr. When the substrate processing system 1 includes the controller group, each of the aforementioned functional modules may be realized by one controller Ctr, or may be realized by a combination of two or more controllers Ctr. When the controller Ctr is composed of multiple computers (circuits Ctr1), each of the aforementioned functional modules may be realized by one computer (circuit Ctr1), or may be realized by a combination of two or more computers (circuits Ctr1). The controller Ctr may include multiple processors Ctr2. In this case, each of the aforementioned functional modules may be realized by one processor Ctr2, or may be realized by a combination of two or more processors Ctr2.

Hereinafter, an information processing method performed by the controller Ctr for a case that mainly focuses on the warpage of the substrate W as the aforementioned deformation factor of the front surface Wa will be described by way of example. In this case, in the information processing method performed by the controller Ctr described above, obtaining the information on the deformation factor of the front surface Wa includes obtaining a warpage amount of the target substrate, and calculating the correction coefficient based on the information on the deformation factor of the front surface Wa includes calculating the correction coefficient based on a warpage coefficient of a reference substrate having a known warpage amount and the warpage amount of the target substrate. Hereinafter, the information processing method will be described in detail by dividing the same into a warpage coefficient calculation method and a correction method.

[Warpage Coefficient Calculation Method]

Figure 16:
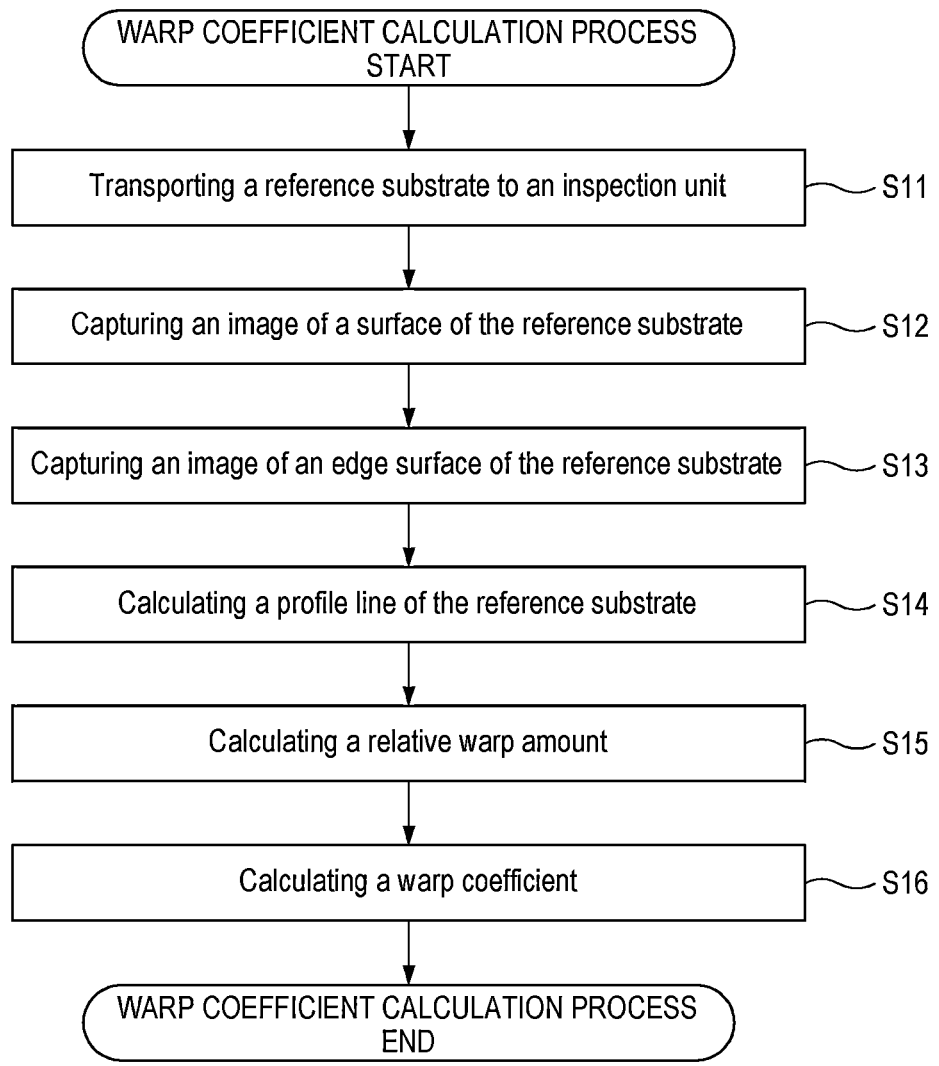
FIG. 16 is a flowchart for explaining an example of a process for calculating a warpage coefficient.

Subsequently, a method of obtaining a warpage coefficient based on a reference substrate using the inspection unit U3 will be described with reference to FIG. 16.

Figure 17A:
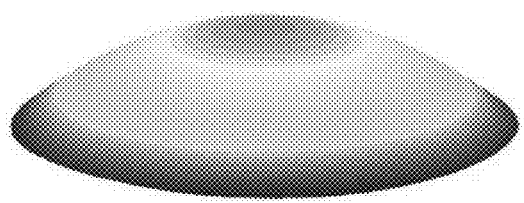
FIG. 17A illustrates a perspective view showing a substrate that exhibits an upwardly protruding paraboloid shape.
Figure 17B:
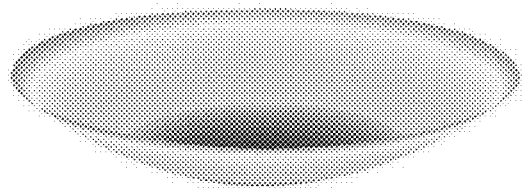
FIG. 17B is a perspective view showing a substrate that exhibits a downwardly protruding paraboloid shape.

Here, the reference substrate refers to a substrate W whose flatness or non-flatness is known, and is designated by a reference symbol "$W_S$" below. The reference substrate $W_S$ may include a flat reference substrate $W_{SF}$ and a non-flat reference substrate $W_{SW}$. The reference substrate $W_{SW}$ includes a reference substrate $W_S$, as shown in FIG. 17A, (having a dome shape that is warped so that the height decreases toward the peripheral edge), which exhibits an upwardly protruding paraboloid shape and a reference substrate $W_S$, as shown in FIG. 17B, (having a bowl shape that is warped so that the height increases toward the peripheral edge), which exhibits a downwardly protruding paraboloid shape.

Examples of an index for evaluating flatness of the reference substrate $W_S$ include GBIR (Global Backside Ideal Focal Plane Range), SFQR (Site Front-side Least Squares Focal Plane Range), SBIR (Site Back-side Ideal Focal Plane Range), ROA (Roll Off Amount), ESFQR (Site Front-side Least Squares Focal Plane Range), ZDD (Z-height Double Differentiation), and the like that are defined in SEMI (Semiconductor Equipment and Materials International) standard. The reference substrate $W_{SF}$ may have, for example, flatness with a maximum SFQR value of about 100 nm, about 42 nm, about 32 nm, or about 16 nm.

First, the controller Ctr controls each unit of the coating and development apparatus 2 to transport the reference substrate $W_S$ to the inspection unit U3 (step S11). Next, the controller Ctr controls the rotary holding unit 200 to cause the holding support 201 to hold the reference substrate $W_S$. Next, the controller Ctr controls the rotary holding unit 200 to cause the actuator 203 to move the holding support 201 from the first position to the second position along the guide rail 204.

At this time, the controller Ctr controls the surface imaging unit 300 to turn on the light source 322 and to capture an image by the camera 310 (step S12). When the reference substrate $W_S$ reaches the second position and the image capturing by the camera 310 is completed, the data of the captured image (surface image) obtained by the camera 310 is transmitted to the memory unit M2. When the imaging by the camera 310 is completed, the reference substrate $W_S$ is located between the lighting module 420 and the mirror member 430.

Figure 18:
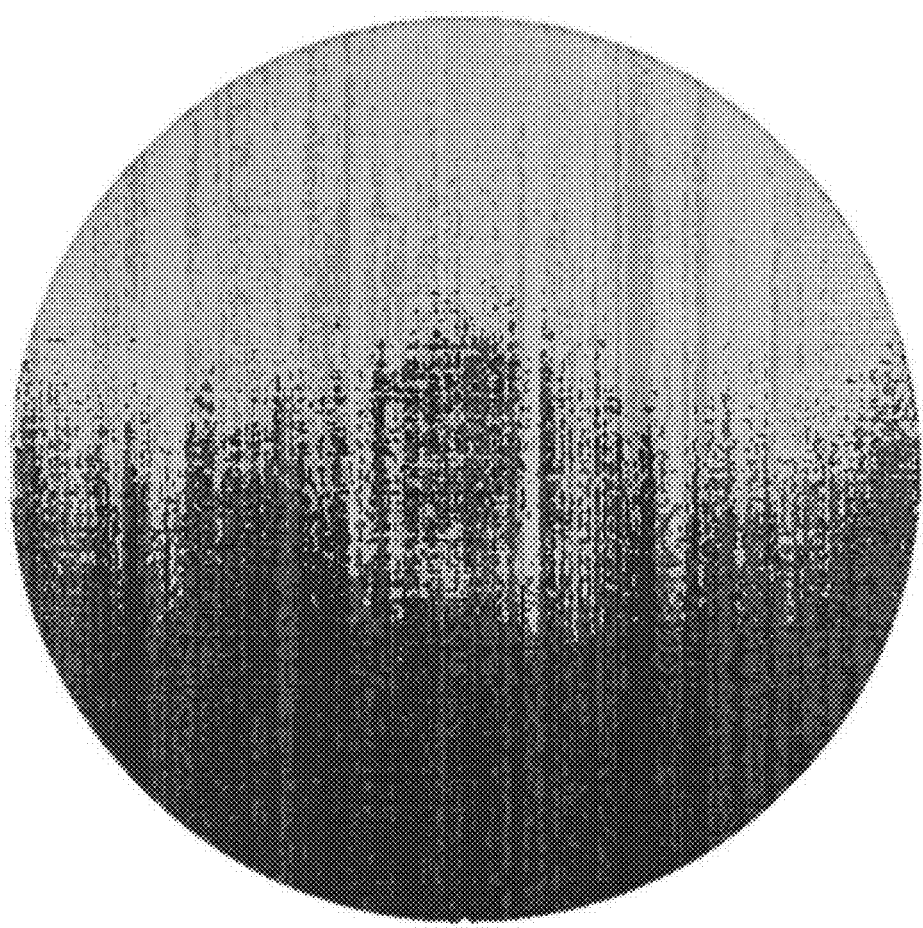
FIG. 18 is a diagram showing an example of a front surface image of a dome-shaped reference substrate.

FIG. 18 shows an example of a surface image of the dome-shaped reference substrate $W_{SW}$. As shown in FIG. 18, a brightness value of the surface image changes depending on the warped state of the reference substrate $W_{SW}$. In the following description, a brightness value at an arbitrary coordinate (x, y) of a pixel in the surface image may be expressed as I(x, y).

Next, the controller Ctr controls the rotary holding unit 200 to cause the actuator 202 to rotate the holding support 201. As a result, the reference substrate $W_S$ is rotated. In this state, the controller Ctr controls the edge imaging unit 400 to turn on the light source 421 and to capture an image by the camera 410 (step S13). Accordingly, the edge surface of the reference substrate $W_S$ is captured as an image. The captured image (edge surface image) for the edge surface of the reference substrate $W_S$ that is obtained by the camera 410 is stored in the memory unit M2.

Figure 19:
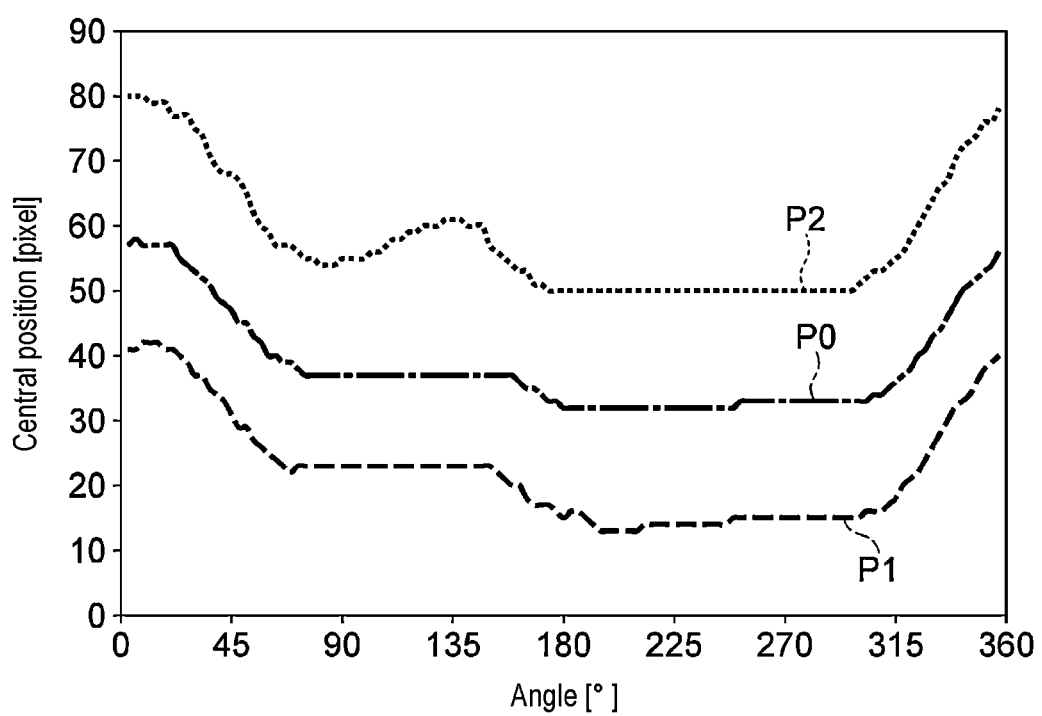
FIG. 19 is a graph showing an example of a profile line for the reference substrate.

Next, the calculation unit M31 computes a profile line (warpage amount) of the reference substrate $W_S$ based on the edge surface image obtained in step S13 (step S14). The calculation unit M31 determines, for example, based on a contrast difference of the edge surface image, an upper edge and a lower edge of the edge surface of the reference substrate $W_S$. Then, the calculation unit M31 calculates a line passing through an intermediate position between the upper edge and the lower edge as a profile line. In this way, a shape of the edge surface for the reference substrate $W_S$ is acquired. As an example, the profile lines P0, P1 and P2 of the reference substrate $W_S$ are shown in FIG. 19.

The profile line P0 is an example of the profile line for the reference substrate $W_{SF}$. Each of the profile lines P1 and P2 is an example of the profile line of the reference substrates $W_{SW}$.

The profile line P1 is an example of the profile line for the dome-shaped reference substrate $W_{SW}$ (see FIG. 17A). When a central portion of the reference substrate $W_S$ is used as a reference, a height of the peripheral edge of the dome-shaped reference substrate $W_{SW}$ is smaller than a height of the peripheral edge of the reference substrate $W_{SF}$. Therefore, the profile line P1 tends to extend along the profile line P0 without exceeding the profile line P0 (see FIG. 17A).

The profile line P2 is an example of the profile line of the bowl-shaped reference substrate $W_{SW}$ (see FIG. 17B). When a central portion of the reference substrate $W_S$ is used as a reference, a height of the peripheral edge of the bowl-shaped reference substrate $W_{SW}$ is greater than a height of the peripheral edge of the reference substrate $W_{SF}$. Therefore, the profile line P2 tends to extend along the profile line P0 without falling below the profile line P0 (see FIG. 17B).

Next, the calculation unit M31 calculates a relative warpage amount (warpage amount) of the reference substrates $W_{SW}$ with respect to the reference substrate $W_{SF}$, based on the profile line P0 of the reference substrate $W_{SF}$ and the profile lines P1 and P2 of the reference substrate $W_{SW}$ (step S15). For example, when the reference substrate $W_{SW}$ has a dome shape, the calculation unit M31 may calculate a relative warpage amount $\Delta P$ (μm) by subtracting a value of the profile line P0 of the reference substrate $W_{SF}$ at a predetermined coordinate (angle) of the reference substrate $W_{SW}$ from a value of the profile line P1 at the predetermined coordinate (angle) of the reference substrate $W_{SW}$. For example, the calculation unit M31 may compute a relative warpage amount $\Delta P$ at the position of 90° by the following equation.

$$\Delta P = P1(90°) - P0(90°)$$

The calculation unit M31 may calculate the relative warpage amount $\Delta P$ based on a difference between an average value $P1_M$ of the profile line P1 and an average value $P2_M$ of the profile line P2. For example, the calculation unit M31 may calculate the relative warpage amount $\Delta P$ by the following equation.

$$\Delta P = P1_M - P2_M$$

Next, the calculation unit M31 calculates a warpage coefficient $A(x, y)$ based on the relative warpage amount $\Delta P$ of the reference substrate $W_{SW}$ and the surface image of the reference substrate $W_{SW}$ (step S16). For example, based on the relative warpage amount $\Delta P$ and a brightness value $I_W(x, y)$ of the surface image for the reference substrate $W_{SW}$, the calculation unit M31 may obtain a change in a brightness value (i.e., a change in intensity of brightness) per 1 μm of warpage in the reference substrate $W_{SW}$ for each pixel of the surface image for the reference substrate $W_{SW}$, and may calculate the brightness intensity variation as a warpage coefficient $A(x, y)$.

At this time, instead of the brightness value $I_W(x, y)$, the normalized data $I_N(x, y)$, which is obtained by dividing the brightness value $I_W(x, y)$ by the brightness value $I_F(x, y)$ of the surface image for the reference substrate $W_{SF}$, may be used to calculate the warpage coefficient $A(x, y)$. The calculation unit M31 may calculate the warpage coefficient $A(x, y)$ by, for example, the following equation.

$$A(x,y) = |1 - I_N(x,y)|/|\Delta P|$$

The brightness value of the central portion in the surface image for the reference substrate $W_{SW}$ can be assumed to be the same as the brightness value of the surface image of the reference substrate $W_{SF}$. Such assumed brightness value $I_F'(x, y)$, which is the brightness value of the surface image of the reference substrate $W_{SF}$, can be used to compute the normalized data $I_N(x, y)$. The assumed brightness value $I_F'(x, y)$ may also be, for example, a brightness value resulting from averaging about several tens to a 100 pixels arranged in the Y direction of the central portion in the surface image of the reference substrate $W_{SW}$, and replacing a brightness value of every pixel in the Y direction with the averaged brightness value for all pixels in the X direction.

[Correction Method]

Figure 20:
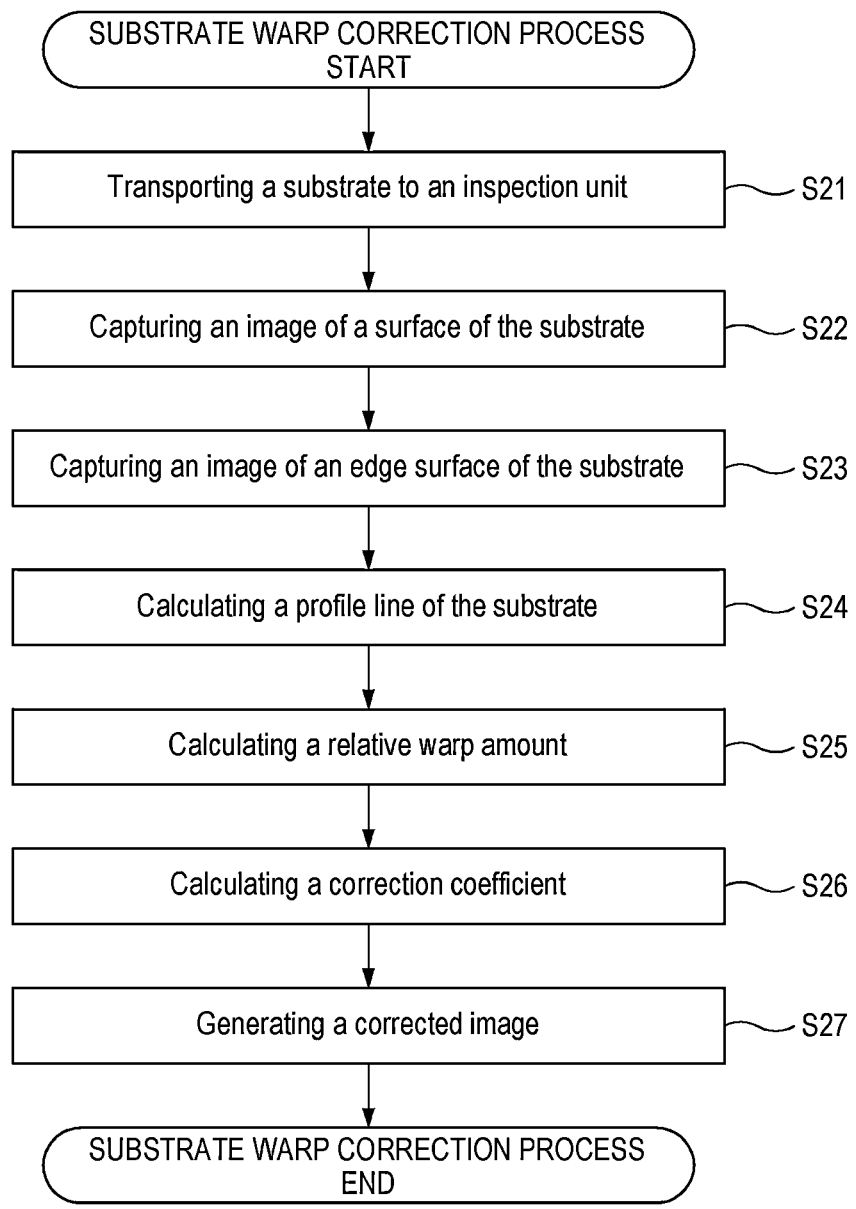
FIG. 20 is a flowchart for explaining an example of a process for correcting a warpage of a substrate.

Subsequently, a method of correcting, by using the inspection unit U3, an effect of a warpage in a product substrate W (hereinafter, referred to as a substrate $W_P$) on a captured image will be described with reference to FIG. 20.

First, the controller Ctr controls each unit of the coating and development apparatus 2 to transport the substrate $W_P$ to the inspection unit U3 (step S21). Next, the controller Ctr controls the rotary holding unit 200 to cause the holding support 201 to hold the substrate W. Next, the controller Ctr controls the rotary holding unit 200 to cause the actuator 203 to move the holding support 201 from the first position to the second position along the guide rail 204.

At this time, the controller Ctr controls the surface imaging unit 300 to turn on the light source 322 and to capture an image by the camera 310 (step S22). When the substrate $W_P$ reaches the second position and the imaging capturing by the camera 310 is completed, the data of the captured image (surface image) of the surface of the substrate $W_P$ captured by the camera 310 is transmitted to the memory unit M2. When the capturing of the image by the camera 310 is completed, the substrate We is located between the lighting module 420 and the mirror member 430.

Next, the controller Ctr controls the rotary holding unit 200 to cause the actuator 202 to rotate the holding support 201. As a result, the substrate We is rotated. At this time, the controller Ctr controls the edge imaging unit 400 to turn on the light source 421 and capture an image by the camera 410 (step S23). In this way, the edge surface of the substrate $W_P$ is imaged. The captured image (edge surface image) for the edge surface of the substrate $W_P$ obtained by the camera 410 is stored in the memory unit M2.

Next, the calculation unit M31 computes, based on the edge surface image obtained in step S12, a profile line (warpage amount) of the substrate $W_P$ (step S24). The calculation unit M31, for example, based on a contrast difference of the edge surface image, determines an upper edge and a lower edge of the edge surface of the substrate $W_P$. Then, the calculation unit M31 calculates a line passing through an intermediate position between the upper edge and the lower edge as a profile line $P_X$. In this way, the shape of the edge surface of the substrate $W_P$ is acquired.

Next, the calculation unit M31 calculates a relative warpage amount (warpage amount) of the substrate $W_P$ with respect to the reference substrate $W_{SF}$, based on the profile line P0 of the reference substrate $W_{SF}$ and the profile line PX of the substrate $W_P$ (step S25). For example, the calculation unit M31 may calculate a relative warpage amount ΔQ (μm) by subtracting a value of the profile line P1 at a predetermined coordinate (angle) of the reference substrate $W_{SF}$, from the value of the profile line PX for the substrate $W_P$ at the predetermined coordinate (angle) of the reference substrate $W_{SF}$. For example, the calculation unit M31 may calculate a relative warpage amount ΔQ at the position of 90° by the following equation.

$$\Delta Q = PX(90°) - P0(90°)$$

Next, the calculation unit M31 calculates a correction coefficient B(x, y), based on the warpage coefficient A(x, y) calculated in step S16 and the relative warpage amount ΔQ (step S26). For example, the calculation unit M31 may compute the correction coefficient B(x, y) by the following equation.

$$B(x,y) = A(x,y) \times \Delta Q + 1$$

Next, based on the correction coefficient B(x, y) calculated in step S26 and the brightness value I(x, y) for the surface image of the substrate $W_P$, the generation unit M32 calculates a brightness value J(x, y) of the corrected image that is obtained by removing the influence of the warpage from the surface image of the substrate $W_P$. The generation unit M32 may compute the brightness value J(x, y) by, for example, dividing the brightness value I(x, y) by the correction coefficient B(x, y). As a result, a corrected image, in which the influence of the warpage for the substrate $W_P$ is corrected, is generated (step S27).

[Action]

According to the above-described example, the correction coefficient B(x, y) is obtained from the warpage coefficient A(x, y) which is based on the reference substrate $W_S$ having a known warpage amount, and the relative warpage amount ΔQ derived from the substrate WP itself for which the correction coefficient B(x, y) is to be calculated. Therefore, the surface image of the substrate $W_P$ is appropriately corrected based on the relative warpage amount ΔQ, which includes its own parameters. Accordingly, even if the substrate $W_P$ has a warpage, it is possible to accurately obtain a corrected image in which the influence of the warpage is corrected.

According to the above-described example, the warpage coefficient A(x, y) can be calculated for each pixel in the surface image of the reference substrate $W_{SW}$. In this case, the correction coefficient B(x, y) is also a value corresponding to each pixel of the surface image of the substrate $W_P$. Therefore, by using the warpage coefficient A(x, y), it is possible to more easily calculate the correction coefficient B(x, y) corresponding to each pixel of the surface image of the substrate $W_P$. In addition, even when the substrate $W_P$ has a warpage, the influence of the warpage can be more effectively corrected by using the correction coefficient B(x, y).

According to the above-described example, the warpage coefficient A(x, y) can be calculated for each pixel of the surface image of the reference substrate $W_{SW}$, based on the brightness value $I_W(x, y)$ of the surface image of the reference substrate $W_{SW}$. In such a case, the corrected image is generated by correcting a brightness value of each pixel of the surface image of the substrate $W_P$, using the correction coefficient B(x, y) obtained from the warpage coefficient A(x, y). Therefore, it is possible to obtain the warpage coefficient A(x, y) and the corrected image by a simple method of calculating a brightness value.

According to the above-described example, the warpage coefficient A(x, y) can be calculated using the normalized data $I_N(x, y)$. In this case, the warpage coefficient A(x, y) can be used to more easily perform subsequent calculations.

According to the above-described example, the warpage amount of the reference substrate $W_{SW}$ can be calculated as the relative warpage ΔP based on the profile line P0 of the reference substrate $W_{SF}$ and the profile lines P1 and P2 of the reference substrates $W_{SW}$. In this case, the influence of warpage due to the weight of the reference substrate $W_{SF}$ is eliminated. Therefore, it is possible to calculate the warpage coefficient A(x, y) with high accuracy.

According to the above-described example, the warpage amount of the substrate $W_P$ can be calculated as the relative warpage amount ΔQ based on the profile line P0 of the reference substrate $W_{SF}$ and the profile line PX of the substrate $W_P$. In this case, the influence of the warpage due to the weight of the substrate $W_P$ is eliminated. Therefore, it is possible to calculate the correction coefficient B(x, y) with high accuracy. Accordingly, even when the substrate $W_P$ has a warpage, it is possible to more effectively correct the influence of the warpage.

On the other hand, in general, the color information of each pixel in a surface image of a substrate W is changed according to the warpage amount of the substrate W. Therefore, as in the above-described example, by generating a model for the warpage coefficient A(x, y) based on the correspondence between the warpage amount and the surface image of the reference substrate $W_{SW}$, it is possible to easily and directly calculate the correction coefficient for the surface image of the substrate $W_P$, using the relationship between the warpage coefficient A(x, y) and the warpage amount of the substrate $W_P$.

According to the above-described example, obtaining the warpage amount for the reference substrate $W_S$ and capturing the surface image of the reference substrate $W_S$ are performed in the same housing 100. Similarly, obtaining the warpage amount of the substrate $W_P$ and obtaining the surface image of the substrate $W_P$ are performed in the same housing 100. Therefore, since the transport of the substrate $W_P$ or the reference substrate $W_S$ is minimized, it is possible to speed up the acquisition of the warpage coefficient A(x, y) or the corrected image.

[Modification]

The disclosure described herein should be considered as an example in all respects and not restrictive. Various omissions, substitutions, changes, and the like may be made to the above-described examples within the scope of the claims and the gist thereof.

(1) The reflection surface 432 may have a shape (e.g., a flat surface shape) other than the curved surface shape.

(2) The edge imaging unit 400 may not include the focus adjustment lens 427.

(3) The edge imaging unit 400 may not include any of the light scattering member 422, the cylindrical lens 425 and the light diffusing member 426.

(4) The inspection unit U3 may be arranged on the shelf units 14 and 15.

(5) In calculating the warpage amount (a relative warpage amount ΔP or ΔQ) of the reference substrate $W_S$ or the substrate $W_P$, an imaging module that is capable of imaging only the edge surface We of the reference substrate $W_S$ or the substrate WP may be used.

(6) The substrate W rotated by the holding support 201 may be rotated eccentrically or rotated in a state in which the central axis is tilted. This is because there may be wobbling of a rotational axle of the holding support 201 itself, shaking due to mechanical assembly tolerance of the holding support 201, wobbling due to tolerance on an attraction surface of the holding support 201, and the like. As a result, the peripheral edge of the substrate W may swing up and down. Therefore, the warpage of the substrate W may be corrected with higher accuracy by suppressing the influence of the rotational shake caused by the holding support 201 using a substrate W for adjustment (hereinafter, referred to as a substrate WA).

For example, before calculating the warpage coefficient, a plurality of warpage amounts (profile lines) of the substrate $W_A$ may be acquired while changing an angle of the substrate $W_A$ with respect to the holding support 201. The acquired profile lines include a component of rotational shake of the substrate $W_A$ caused by the rotary holding unit 200, and a component of warpage of the substrate $W_A$. Therefore, the component of the rotational shake caused by the holding support 201 (the inclination component of the holding support 201) may be calculated based on the plurality of profile lines of the substrate $W_A$.

(7) The warpage amounts (a first warpage amount and a second warpage amount) for two different regions (e.g., the upper half region and the lower half region) of the reference substrate $W_{SW}$ may be acquired respectively. The first warpage coefficient for one region of the reference substrate $W_{SW}$ may be calculated based on the first warpage amount and the surface image of the one region. The second warpage coefficient for the other region of the reference substrate $W_{SW}$ may be calculated based on the second warpage amount and the surface image of the other region.

The warpage amounts (a third warpage amount and a fourth warpage amount) for two different regions (e.g., the upper half region and the lower half region) of the substrate $W_P$, which correspond to the two different regions of the reference substrate $W_{SW}$, may be acquired respectively. The first correction coefficient for one region of the substrate $W_P$ may be calculated based on the third warpage amount and the first warpage coefficient. The second correction coefficient for the other region of the substrate $W_P$ may be calculated based on the fourth warpage amount and the second warpage coefficient.

A first corrected image for one region of the substrate $W_P$ may be generated using the first correction coefficient. A second corrected image for the other region of the substrate $W_P$ may be generated using the second correction coefficient. The first corrected image and the second corrected image may be combined to generate a corrected image of the entire substrate $W_P$. According to the foregoing, even when the warpage amount of one region of the reference substrate $W_{SW}$ and the warpage amount of the other region of the reference substrate $W_{SW}$ are different, or even when the warpage amount of one region of the substrate $W_P$ and the warpage amount of the other region of the substrate $W_P$ are different, it is possible to obtain a corrected image of the substrate $W_P$ with high accuracy.

(8) The calculation of the warpage coefficient, correction coefficient and the like may be performed based on the color information (hue, saturation, lightness, etc.) included in each pixel.

(9) The correction coefficient B(x, y) may be calculated only for the first initial substrate $W_P$ transported from a carrier. In this case, a corrected image may be generated based on the correction coefficient B(x, y) obtained from the first substrate $W_P$ and a brightness value I(x, y) of each surface image for a second or subsequent substrates $W_P$.

(10) The process (step S22) of acquiring brightness values I(x, y) of a surface image for a plurality of substrates WP and the process (steps S23 to S26) of calculating a correction coefficient B(x, y) from at least one of the plurality of substrates $W_P$ may be executed at different timings. For example, after the process (step S22) of acquiring the brightness value I(x, y) of the surface image for the plurality of substrates $W_P$ is completed, the process (steps S23 to S26) of calculating the correction coefficient B(x, y) from at least one of the plurality of substrates $W_P$ may be executed. The brightness values I(x, y) of a surface image for the plurality of substrates $W_P$ that have already been acquired may be collectively corrected by using the correction coefficient B(x, y) (a batch processing of correction).

(11) The warpage coefficient calculation process or the correction process may be executed by the inspection unit U3 independent of the coating and development apparatus 2.

OTHER EXAMPLES

Example 1. An example of an information processing method may include: obtaining a warpage amount of a target substrate, obtaining a surface image of the target substrate; calculating a correction coefficient for the surface image of the target substrate based on a warpage coefficient generated based on a reference substrate having a known warpage amount, and a warpage amount of the target substrate; and generating a corrected image of the target substrate by correcting the surface image of the target substrate using the correction coefficient. In this case, the correction coefficient is obtained from the warpage coefficient derived from the reference substrate whose warpage amount is known, and the warpage amount derived from the target substrate for which the correction coefficient is to be calculated. Therefore, the surface image of the target substrate is appropriately corrected based on the warpage amount derived from its own parameters. Accordingly, even when the target substrate has a warpage, it is possible to accurately obtain a corrected image in which the influence of the warpage is corrected.

Example 2. In the method of Example 1, calculating the correction coefficient may include calculating a correction coefficient corresponding to each pixel in the surface image of the target substrate. In this case, the surface image of the target substrate is corrected for each pixel. Therefore, even when the target substrate has a warpage, it is possible to more effectively correct the influence of the warpage.

Example 3. In the method of Example 1 or Example 2, generating the corrected image may include generating a corrected image by correcting a brightness value of each pixel of the surface image of the target substrate based on the correction coefficient. In this case, it is possible to obtain a corrected image by a simple method of calculating the brightness value.

Example 4. In the method of any one of Examples 1 to 3, obtaining the warpage amount of the target substrate may include calculating the warpage amount of the target substrate based on profile line data for an edge surface of a substantially flat reference substrate and profile line data for an edge surface of the target substrate. In this case, the influence of warpage due to the weight of the target substrate is eliminated. Therefore, even when the target substrate has a warpage, it is possible to more effectively correct the influence of the warpage.

Example 5. The method of any one of Examples 1 to 4 may further include: obtaining a warpage amount of the reference substrate, obtaining a surface image of the reference substrate, and calculating a warpage coefficient based on the warpage amount of the reference substrate and the surface image of the reference substrate. In this case, the warpage coefficient is modeled by a correspondence between a warpage amount of the reference substrate and a surface image of the reference substrate. In general, the color information of each pixel in a surface image of a substrate varies according to the warpage amount of the substrate. Therefore, it is possible to easily and directly calculate a correction coefficient for a surface image of the target substrate based on the relationship between the warpage coefficient specified in Example 5 and the warpage amount of the target substrate.

Example 6. In the method of Example 5, calculating the warpage coefficient may include calculating a warpage coefficient for each pixel of the surface image of the reference substrate. In this case, by using the warpage coefficient corresponding to each pixel of the surface image of the reference substrate, it is possible to more easily calculate a correction coefficient corresponding to each pixel of the surface image of the target substrate.

Example 7. In the method of Example 6, calculating the warpage coefficient may include calculating a warpage coefficient for each pixel of the surface image of the reference substrate based on the warpage amount of the reference substrate and a brightness value of each pixel of the surface image of the reference substrate. In this case, the warpage coefficient can be obtained by a simple method of calculating a brightness value.

Example 8. In the method of Example 7, calculating the warpage coefficient may include generating normalized data including a normalized brightness value of each pixel in the surface image based on a brightness value of a central region in the surface image of the reference substrate, and calculating a warpage coefficient based on the warpage amount and the normalized data of the reference substrate. In this case, subsequent calculations can be more easily performed using the warpage coefficient.

Example 9. In the method of any one of Examples 5 to 8, obtaining the warpage amount of the reference substrate may include calculating a warpage amount of the reference substrate based on profile line data for an edge surface of a substantially flat reference substrate and profile line data for an edge surface of a non-flat reference substrate. In this case, the influence of warpage due to the weight of the reference substrate is eliminated. Therefore, it is possible to calculate the warpage coefficient with high accuracy.

Example 10. In the method of Example 9, the non-flat reference substrate may have a form of an upwardly protruding paraboloid or a downwardly protruding paraboloid.

Example 11. The method of any one of Examples 5 to 10 may further include: obtaining a warpage amount for each of two different regions in the reference substrate; and calculating a warpage coefficient for each of the two different regions based on the surface image of the reference substrate and the warpage amount for a respective one of the two different regions. In this case, even when the warpage amount in one region of the reference substrate and the warpage amount in the other region of the reference substrate are different, it is possible to accurately obtain a corrected image of the target substrate.

Example 12. The method of any one of Examples 1 to 11 may further include: calculating an inclination component of a substrate holder based on the two warpage amounts of an adjustment substrate, in which the two warpage amounts of an adjustment substrate are obtained by changing the angle of the adjustment substrate with respect to the substrate holder. In this case, it is possible to remove the influence of the inclination of the substrate holder that holds the substrate, from the warpage amount of the substrate.

Example 13. In the method of any one of Examples 1 to 12, obtaining the warpage amount of the target substrate and obtaining the surface image of the target substrate may be performed in the same housing. In this case, because the transfer of the target substrate is minimized, it is possible to speed up the acquisition of a corrected image.

Example 14. An example of an information processing apparatus includes: a memory unit configured to store a warpage coefficient generated based on a reference substrate having a known warpage amount, a warpage amount of a target substrate, and a surface image of the target substrate; a calculation unit configured to calculate a correction coefficient for the surface image of the target substrate based on the warpage coefficient and the warpage amount of the target substrate; and a generation unit configured to generate a corrected image of the target substrate by correcting the surface image of the target substrate using the correction coefficient. In this case, it is possible to obtain the same operative effects as in Example 1.

Example 15. A computer-readable recording medium may store a program for causing an information processing apparatus to execute the method in any one of Examples 1 to 13. In this case, it is possible to obtain the same operative effects as in the method of Example 1. In this disclosure, the computer-readable recording medium may include a non-transitory computer recording medium (e.g., various main storage devices or auxiliary storage devices), or propagation signals (transitory computer recording medium) (e.g., data signals that can be provided via a network).

2. Second Embodiment

Figure 21:
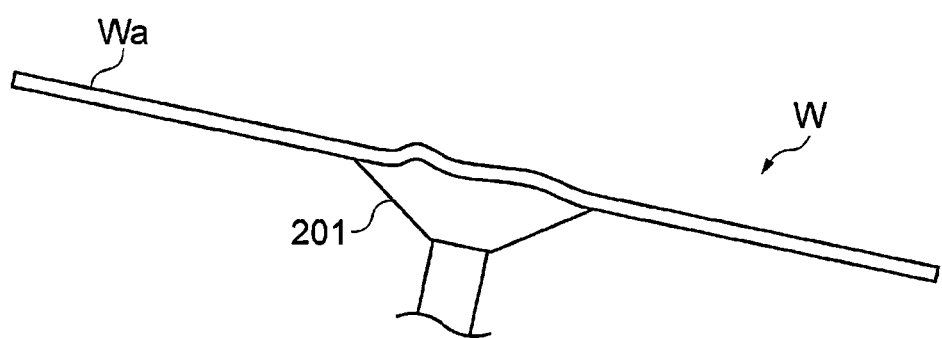
FIG. 21 illustrates a schematic view showing an inclined holding support and a substrate.

In the above-described first embodiment, the information processing method performed by the controller Ctr for a case that mainly focuses on the warpage of the substrate W, as the aforementioned deformation factor of the front surface Wa, has been disclosed. In a second embodiment, a configuration for a case that mainly focuses on the unevenness of the surface of the holding support 201 and the inclination of the substrate W due to the inclination of the holding support 201, as the deformation factor of the substrate W, is disclosed (see FIG. 21).

[Substrate Processing System]

Figure 22:
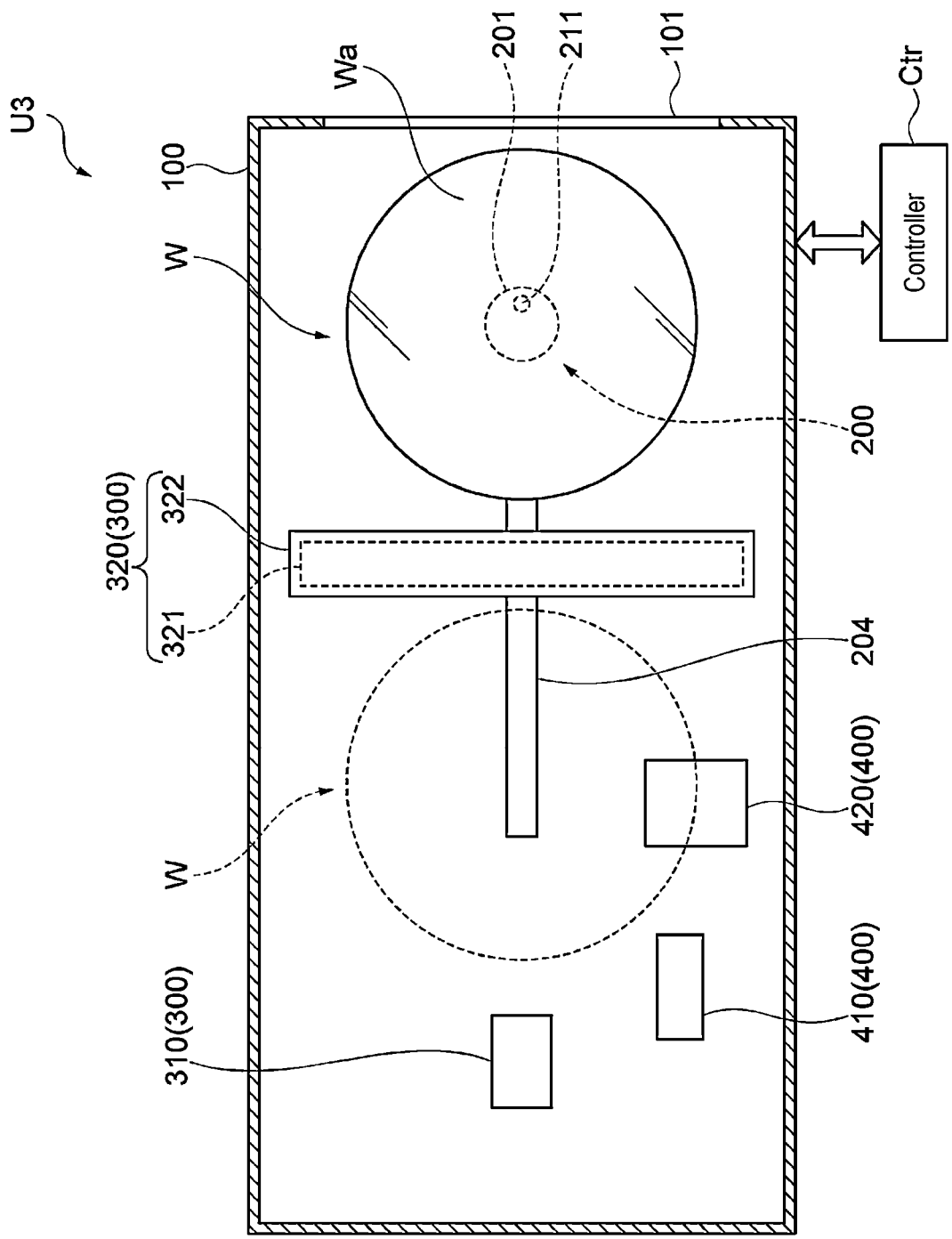
FIG. 22 illustrates a cross-sectional view of an example of an inspection unit as viewed from above.

As long as the same holding support 201 is used, the unevenness of the surface of the holding support 201 is considered to affect the shape of the substrate W with high reproducibility. However, as described above, the holding support 201 is rotatable. Accordingly, the influence of the deformation factor related to the holding support 201 on the image information for the front surface Wa of the substrate W, and the influence of the holding support 201 on the shape of the substrate W may be varied depending on the rotation angle of the holding support 201. Thus, in the second embodiment, it is necessary to determine an inclination of the holding support 201 in the image obtained by the surface imaging unit 300. Therefore, in the second embodiment, as shown in FIG. 22, the holding support 201 is provided with an index 211 (the inspection unit U3 further includes the index 211). Specific examples of the index 211 include an index hole and the like.

In the information processing method performed by the controller Ctr that considers the deformation factor related to the holding support 201, a process of obtaining a surface image of a target substrate includes obtaining the surface image of the target substrate held by the rotatable holding support 201, a process of obtaining information on the deformation factor of the surface includes obtaining information on the rotation angle of the holding support 201 when obtaining the surface image of the target substrate, and a process of calculating a correction coefficient based on the information on the deformation factor of the front surface Wa includes calculating the correction coefficient based on the rotation angle information of the holding support 201.

A process of calculating the correction coefficient based on the information on the deformation factor of the front surface Wa may include calculating the correction coefficient based on the rotation angle information of the holding support 201 and a coefficient model that represents a relationship between the rotation angle of the holding support 201 and the correction coefficient.

Hereinafter, this information processing method will be separately described in detail for a coefficient model calculation method and a corrected image generation method.

[Coefficient Model Calculation Method]

Figure 23:
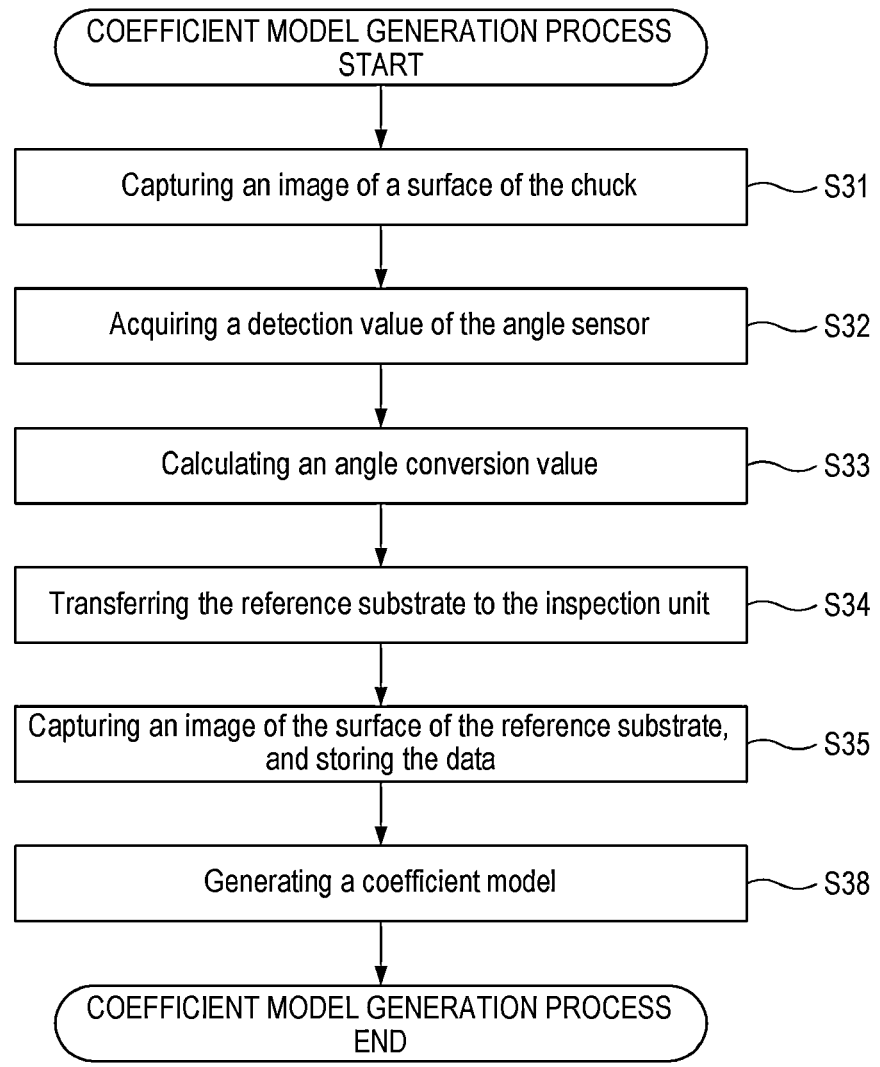
FIG. 23 is a flowchart for explaining an example of a process for calculating a coefficient model.

As shown in FIG. 23, first, the controller Ctr controls the rotary holding unit 200 to cause the actuator 203 to move the holding support 201 from the first position to the second position along the guide rail 204. At this time, the controller Ctr controls the surface imaging unit 300 to turn on the light source 322 and to capture an image by the camera 310 (step S31). When the holding support 201 reaches the second position and the image capturing by the camera 310 is completed, the data of the captured image (chuck surface image) obtained by the camera 310 is transmitted to the memory unit M2.

Next, the calculation unit M31 acquires information on the rotation angle of the holding support 201 from the rotary holding unit 200 (step S32). As an example, the rotary holding unit 200 transmits a detection value of the rotation angle of the holding support 201 detected by a rotation angle sensor (e.g., a rotary encoder) of the actuator 202 to the memory unit M2. The calculation unit M31 acquires the detection value of the rotation angle of the holding support 201 detected by the rotation angle sensor from the memory unit M2. Hereinafter, the detection value of the rotation angle of the holding support 201 detected by the rotation angle sensor will be referred to as a "sensor angle."

Next, the calculation unit M31 calculates the rotation angle of the holding support 201 in a chuck surface image based on the position of the index 211 in the chuck surface image acquired in step S31. Hereinafter, the rotation angle of the holding support 201 in the chuck surface image will be referred to as "in-image chuck angle." The calculation unit M31 calculates an angle conversion value for converting the sensor angle into the in-image chuck angle, and stores the angle conversion value in the memory unit M2 (step S33).

Next, the controller Ctr controls each unit of the coating and development apparatus 2 to transport the reference substrate $W_S$ to the inspection unit U3 (step S34). Next, the controller Ctr controls the rotary holding unit 200 to cause the holding support 201 to hold the reference substrate $W_S$.

Next, the controller Ctr causes the actuator 202 to rotate the holding support 201 together with the reference substrate $W_S$, and causes the surface imaging unit 300 to acquire a surface image of the reference substrate $W_S$ at each of a plurality of rotation angles. Hereinafter, each of the plurality of surface images thus acquired will be referred to as a "reference image."

As an example, the controller Ctr causes the actuator 203 to move the holding support 201 from the first position to the second position along the guide rail 204 for each of a plurality of rotation angles. At this time, the controller Ctr controls the surface imaging unit 300 to turn on the light source 322 and perform imaging by the camera 310. When the reference substrate $W_S$ reaches the second position and the image capturing by the camera 310 is completed, the data of the reference image captured by the camera 310 is transmitted to the memory unit M2 (step S35).

After the image capturing at each of the plurality of rotation angles and the accumulation of the data are completed in step S35, the calculation unit M31 generates a coefficient model representing a relationship between a rotation angle of the holding support 201 (e.g., the in-image chuck angle) and a correction coefficient based on all the reference images, and stores the coefficient model in the memory unit M2. For example, the controller Ctr generates an angle-coefficient function representing a relationship between a rotation angle of the holding support 201 (e.g., the in-image chuck angle) and a pixel value (e.g., the brightness value or the color information) for each reference image and for each pixel in the reference image (step S38). A set of a plurality of angle-coefficient functions generated for each pixel corresponds to an example of a coefficient model. Further, a pixel value for each pixel derived based on the rotation angle of the holding support 201 and the angle-coefficient function, corresponds to an example of a correction coefficient. Hereinafter, this pixel value will be referred to as a "correction pixel value." Accordingly, the generation of the coefficient model is completed.

[Corrected Image Generation Method]

As shown in FIG. 24, the controller Ctr controls each unit of the coating and development apparatus 2 to transfer the substrate $W_P$ to the inspection unit U3 (step S41). Next, the controller Ctr controls the rotary holding unit 200 to cause the holding support 201 to hold the substrate WP.

Next, the calculation unit M31 obtains, from a memory unit Me, a detection value of the rotation angle of the holding support 201 (the sensor angle) detected by the rotation angle sensor, and calculates the in-image chuck angle based on the angle conversion value and the sensor angle stored in the memory unit M2 (step S42).

Next, the controller Ctr controls the rotary holding unit 200 to cause the actuator 203 to move the holding support 201 from the first position to the second position along the guide rail 204. At this time, the controller Ctr controls the surface imaging unit 300 to turn on the light source 322 and to capture an image by the camera 310 (step S43). When the substrate WP reaches the second position and the image capturing by the camera 310 is completed, the data of the captured image (surface image) obtained by the camera 310 is transmitted to the memory unit M2.

Next, the calculation unit M31 calculates a correction coefficient based on the in-image chuck angle computed in step S42, and the coefficient model stored in the memory unit M2 (step S44). For example, the calculation unit M31 computes a correction pixel value for each pixel of the surface image based on the angle-coefficient function and the in-image chuck angle.

Next, the generation unit M32 generates, from the surface image of the substrate $W_P$, a corrected image excluding the influence of the deformation factor related to the holding support 201 based on the surface image of the substrate WP and the correction coefficient calculated in step S42. For example, the generation unit M32 subtracts a correction pixel value from a pixel value of each pixel of the surface image of the substrate $W_P$. As a result, a corrected image excluding the influence of the deformation factor on the holding support 201 is generated (step S45).

[Action]

According to the above-described example, by using the correction coefficient that also takes into account the influence of the posture of the holding support 201 on the front surface Wa, the influence of the image change due to the deformation of the front surface Wa of the target substrate can be more reliably removed from the surface image of the target substrate. Accordingly, it is effective in evaluating a surface state of the substrate W with higher accuracy based on the surface image of the substrate W.

According to the above-described example, by using the coefficient model representing the relationship between the correction coefficient and the rotation angle of the holding support 201, it is possible to more easily and appropriately calculate the correction coefficient.

In the above description, there is disclosed a method of generating a coefficient model that considers both the deformation of the substrate W due to the unevenness of the surface of the holding support 201, and the inclination of the substrate W due to the inclination of the holding support 201. However, the coefficient model may be generated by considering only one of them. For example, when the inclination of the holding support 201 is so small that it can be ignored, the coefficient model may be generated in consideration of only the deformation of the substrate W due to the unevenness of the surface of the holding support 201.

The information processing method of the first embodiment focusing on the warpage amount of the substrate W and the information processing method of the second embodiment focusing on the deformation factor related to the holding support 201 may be combined with each other.

The information processing method, the information processing apparatus and the computer-readable recording medium according to the present disclosure are effective in evaluating a processing state of a substrate's surface with high reliability based on a surface image of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An information processing method, comprising:
obtaining information on a deformation factor of a surface of a target substrate;
obtaining a surface image of the target substrate;
calculating a correction coefficient for correcting an image change due to deformation of the surface, based on the information on the deformation factor of the surface, wherein calculating the correction coefficient based on the information of the deformation factor comprises calculating the correction coefficient based on a warpage coefficient, which is based on a reference substrate having a known warpage amount, and a warpage amount of the target substrate;
generating a corrected image of the target substrate by correcting the surface image of the target substrate using the correction coefficient;
obtaining a warpage amount of the reference substrate;
obtaining a surface image of the reference substrate; and
calculating the warpage coefficient based on the warpage amount of the reference substrate and the surface image of the reference substrate,
wherein obtaining the information on the deformation factor of the surface comprises obtaining the warpage amount of the target substrate, and
wherein calculating the warpage coefficient comprises:
generating normalized data including a normalized brightness value of each pixel of the surface image of the reference substrate based on a brightness value of a central region in the surface image of the reference substrate; and
calculating the warpage coefficient based on the warpage amount of the reference substrate and the normalized data.

2. The method of claim 1, wherein calculating the correction coefficient comprises calculating the correction coefficient corresponding to each pixel of the surface image of the target substrate.

3. The method of claim 2, wherein generating the corrected image comprises generating the corrected image by correcting a brightness value of each pixel of the surface image of the target substrate using the correction coefficient.

4. The method of claim 3, wherein obtaining the warpage amount of the target substrate comprises calculating the warpage amount of the target substrate based on profile line data for an edge surface of a substantially flat reference substrate and profile line data on an edge surface of the target substrate.

5. The method of claim 1, wherein generating the corrected image comprises generating the corrected image by correcting a brightness value of each pixel of the surface image of the target substrate using the correction coefficient.

6. The method of claim 1, wherein obtaining the warpage amount of the target substrate comprises calculating the warpage amount of the target substrate based on profile line data for an edge surface of a substantially flat reference substrate and profile line data on an edge surface of the target substrate.

7. The method of claim 1, wherein obtaining the warpage amount of the reference substrate comprises calculating the warpage amount of the reference substrate based on profile line data for an edge surface of a substantially flat reference substrate and profile line data for an edge surface of a non-flat reference substrate.

8. The method of claim 7, wherein the non-flat reference substrate has a form of an upwardly protruding paraboloid or a downwardly protruding paraboloid.

9. The method of claim 1, further comprising:
obtaining the warpage amount for each of two different regions in the reference substrate; and
calculating the warpage coefficient for each of the two regions based on the surface image of the reference substrate and the warpage amount for the two regions.

10. The method of claim 1, further comprising:
calculating an inclination component of a substrate holder based on two warpage amounts of an adjustment substrate, wherein the two warpage amounts of the adjustment substrate are obtained by changing an angle of the adjustment substrate with respect to the substrate holder.

11. The method of claim 1, wherein obtaining the warpage amount of the target substrate and obtaining the surface image of the target substrate are performed in a same housing.

12. The method of claim 1, wherein:
obtaining the surface image of the target substrate comprises obtaining the surface image of the target substrate held by a rotatable chuck;
obtaining the information on the deformation factor comprises obtaining rotation angle information of the chuck when obtaining the surface image of the target substrate; and
calculating the correction coefficient based on the information on the deformation factor comprises calculating the correction coefficient based on the rotation angle information of the chuck.

13. The method of claim 12, wherein calculating the correction coefficient based on the information on the deformation factor comprises calculating the correction coefficient based on a coefficient model and the rotation angle information of the chuck, and wherein the coefficient model represents a relationship between a rotation angle of the chuck and the correction coefficient.

14. An information processing apparatus, comprising:
a memory unit configured to store a surface image of a target substrate, and information on a deformation factor of a surface of the target substrate;
a calculation unit configured to calculate a correction coefficient for correcting an image change due to deformation of the surface image of the target substrate, based on the information on the deformation factor of the surface of the target substrate; and
a generation unit configured to generate a corrected image of the target substrate by correcting the surface image of the target substrate using the correction coefficient,
wherein the calculation unit is configured to:
calculate the correction coefficient based on the information of the deformation factor of the surface by calculating the correction coefficient based on a warpage coefficient, which is based on a reference substrate having a known warpage amount, and a warpage amount of the target substrate, and
calculate the warpage coefficient based on the warpage amount of the reference substrate and a surface image of the reference substrate by generating normalized data including a normalized brightness value of each pixel of the surface image of the reference substrate based on a brightness value of a central region in the surface image of the reference substrate, and calculating the warpage coefficient based on the warpage amount of the reference substrate and the normalized data.

15. A non-transitory computer-readable recording medium storing a program that causes an information processing apparatus to perform an information processing method which comprises:
obtaining information on a deformation factor regarding deformation of a surface of a target substrate;
obtaining a surface image of the target substrate;
calculating a correction coefficient for correcting an image change due to deformation of the surface, based on the information on the deformation factor, wherein calculating the correction coefficient based on the information of the deformation factor comprises calculating the correction coefficient based on a warpage coefficient, which is based on a reference substrate having a known warpage amount, and a warpage amount of the target substrate;
generating a corrected image of the target substrate by correcting the surface image of the target substrate using the correction coefficient;
obtaining a warpage amount of the reference substrate;
obtaining a surface image of the reference substrate; and
calculating the warpage coefficient based on the warpage amount of the reference substrate and the surface image of the reference substrate,
wherein obtaining the information on the deformation factor of the surface comprises obtaining the warpage amount of the target substrate, and
wherein calculating the warpage coefficient comprises:
generating normalized data including a normalized brightness value of each pixel of the surface image of the reference substrate based on a brightness value of a central region in the surface image of the reference substrate; and
calculating the warpage coefficient based on the warpage amount of the reference substrate and the normalized data.

* * * * *